(12) United States Patent
Feng et al.

(10) Patent No.: US 11,545,093 B2
(45) Date of Patent: Jan. 3, 2023

(54) SHIFT REGISTER, GATE DRIVING CIRCUIT, DISPLAY DEVICE AND GATE DRIVING METHOD

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/427,607

(22) PCT Filed: Jan. 22, 2021

(86) PCT No.: PCT/CN2021/073253
§ 371 (c)(1),
(2) Date: Jul. 30, 2021

(87) PCT Pub. No.: WO2021/147990
PCT Pub. Date: Jul. 29, 2021

(65) Prior Publication Data
US 2022/0101796 A1 Mar. 31, 2022

(30) Foreign Application Priority Data
Jan. 22, 2020 (CN) .......................... 202010075648.0

(51) Int. Cl.
*G09G 5/00* (2006.01)
*G09G 3/3266* (2016.01)
(Continued)

(52) U.S. Cl.
CPC .......... *G09G 3/3266* (2013.01); *G11C 19/28* (2013.01); *G09G 3/20* (2013.01);
(Continued)

(58) Field of Classification Search
CPC .................. G09G 3/20; G09G 3/3266; G09G 2310/0267; G09G 2310/0286;
(Continued)

(56) References Cited

U.S. PATENT DOCUMENTS

2013/0169609 A1* 7/2013 Son ...................... G09G 3/3677
345/209
2019/0103049 A1* 4/2019 Noh ...................... G09G 3/3266
(Continued)

FOREIGN PATENT DOCUMENTS

CN 102316282 A 1/2012
CN 105513524 A 4/2016
(Continued)

*Primary Examiner* — Adam J Snyder
(74) *Attorney, Agent, or Firm* — Houtteman Law LLC

(57) ABSTRACT

A shift register, a gate driving circuit and a gate driving method are provided. The shift register includes: a display pre-charging reset circuit, a display noise reduction circuit and an output circuit, the output circuit is provided with at least one signal output terminal, and includes at least one output sub-circuit; the display pre-charging reset circuit is configured to write a first scanning voltage into a pull-up node in response to a control of a first signal input terminal; and write a second scanning voltage into the pull-up node in response to a control of a second signal input terminal; the display noise reduction circuit is configured to write the second scanning voltage into a pull-down node in response to the control of the first signal input terminal; and write the first scanning voltage into the pull-down node in response to the control of the second signal input terminal.

1 Claim, 15 Drawing Sheets

(51) Int. Cl.
 *G11C 19/28* (2006.01)
 *G09G 3/20* (2006.01)
(52) U.S. Cl.
 CPC .............. *G09G 2310/0267* (2013.01); *G09G 2310/0286* (2013.01); *G09G 2310/061* (2013.01); *G09G 2310/08* (2013.01); *G09G 2320/0214* (2013.01)
(58) Field of Classification Search
 CPC ......... G09G 2310/061; G09G 2310/08; G09G 2320/0214; G11C 19/28
 See application file for complete search history.

(56) References Cited

U.S. PATENT DOCUMENTS

| | | | |
|---|---|---|---|
| 2019/0139475 A1 | 5/2019 | Wang et al. | |
| 2020/0035316 A1* | 1/2020 | Feng | G09G 3/3266 |
| 2021/0201805 A1* | 7/2021 | Feng | G09G 3/3266 |

FOREIGN PATENT DOCUMENTS

| | | | | |
|---|---|---|---|---|
| CN | 107045778 A | | 8/2017 | |
| CN | 108682397 A | * | 10/2018 | ........... G09G 3/3208 |
| CN | 109166529 A | * | 1/2019 | ........... G09G 3/3225 |
| CN | 109949749 A | | 6/2019 | |
| CN | 110136653 A | | 8/2019 | |
| CN | 110491329 A | | 11/2019 | |
| CN | 111179808 A | | 5/2020 | |
| WO | 2017181647 A1 | | 10/2017 | |
| WO | 2019184339 A1 | | 10/2019 | |

* cited by examiner

SHIFT REGISTER, GATE DRIVING CIRCUIT, DISPLAY DEVICE AND GATE DRIVING METHOD

CROSS-REFERENCE TO RELATED APPLICATIONS

The present application claims the priority of Chinese Patent Application No. 202010075648.0, filed on Jan. 22, 2020, the contents of which are incorporated herein in their entirety by reference.

TECHNICAL FIELD

The present disclosure relates to the field of display technology, and in particular to a shift register, a gate driving circuit, a display device and a gate driving method.

BACKGROUND

In the related art, transistors are integrated on an array substrate by using a Gate Driver on Array (GOA) technology, so as to scan and drive gate lines in a display panel, and thus a Gate Driver IC can be omitted, which facilitates to implement a narrow bezel.

For a display panel with an external compensation function, each gate driving element in a gate driving circuit (including a plurality of gate driving elements cascaded) is required to not only output a driving signal for controlling a display switch transistor to be turned on in a display driving stage, but also output a driving signal for controlling a sensing switch transistor to be turned on in a sensing stage, that is, the gate driving element is required to have a function of outputting a double pulse signal. However, since a shift register in the related art can output only a single pulse signal, a case where one gate driving element includes only one shift register cannot satisfy driving requirements.

In order to solve the above technical problem, in the related art, two shift registers and a signal combining circuit are often used to form a gate driving element, and the gate driving element has a function of outputting a double pulse signal. However, for a design that the gate driving element includes two shift registers and one signal combining circuit, the number of transistors required to be arranged is relatively large, which is not favorable for implementing a narrow bezel.

SUMMARY

In a first aspect, an embodiment of the present disclosure provides a shift register, including: a display pre-charging reset circuit, a sensing control circuit, a sensing pre-charging reset circuit, a pull-down control circuit, a display noise reduction circuit and an output circuit, where the sensing control circuit and the sensing pre-charging reset circuit are coupled to a sensing control node, the display pre-charging reset circuit, the sensing pre-charging reset circuit, the pull-down control circuit and the output circuit are coupled to a pull-up node, the pull-down control circuit, the display noise reduction circuit and the output circuit are coupled to a pull-down node, the output circuit is configured with at least one signal output terminal, and the output circuit includes at least one output sub-circuit corresponding to the at least one signal output terminal one to one;

the display pre-charging reset circuit is coupled to a first signal input terminal, a second signal input terminal, a first scanning power supply terminal and a second scanning power supply terminal, and is configured to write a first scanning voltage provided by the first scanning power supply terminal into the pull-up node in response to a control of the first signal input terminal, and write a second scanning voltage provided by the second scanning power supply terminal to the pull-up node in response to a control of the second signal input terminal;

the sensing control circuit is coupled to the signal output terminal and a random signal terminal, and is configured to write an output signal provided by the signal output terminal into the sensing control node in response to a control of the random signal terminal;

the sensing pre-charging reset circuit is coupled to a first clock signal terminal, a sensing reset signal terminal and a second power supply terminal, and is configured to write a voltage signal in an active level state into the pull-up node in response to a control of voltage at the sensing control node, and write a second operating voltage provided by the second power supply terminal into the pull-up node in response to a control of the sensing reset signal terminal;

the pull-down control circuit is coupled to a first power supply terminal and the second power supply terminal, and is configured to write a voltage, with a stage opposite to that of a voltage at the pull-up node, into the pull-down node;

the display noise reduction circuit is coupled to the first signal input terminal, the second signal input terminal, the first scanning power supply terminal and the second scanning power supply terminal, and is configured to write a second scanning voltage into the pull-down node in response to a control of the first signal input terminal, and write a first scanning voltage into the pull-down node in response to a control of the second signal input terminal;

the output sub-circuit is coupled to the pull-up node, the pull-down node, the corresponding signal output terminal, a corresponding output clock signal terminal and a reset power supply terminal, and is configured to write an output clock signal provided by the corresponding output clock signal terminal into the corresponding signal output terminal in response to a control of a voltage at the pull-up node, and write a reset operating voltage provided by the reset power supply terminal into the corresponding signal output terminal in response to a control of a voltage at the pull-down node.

In some implementations, the display pre-charging reset circuit includes: a first display transistor and a second display transistor;

a control electrode of the first display transistor is coupled to the first signal input terminal, a first electrode of the first display transistor is coupled to the first scanning power supply terminal, and a second electrode of the first display transistor is coupled to the pull-up node;

a control electrode of the second display transistor is coupled to the second signal input terminal, a first electrode of the second display transistor is coupled to the pull-up node, and a second electrode of the second display transistor is coupled to the second scanning power supply terminal.

In some implementations, the shift register further includes: an anti-leakage circuit;

the anti-leakage circuit includes: a first anti-leakage transistor, a second anti-leakage transistor and a third anti-leakage transistor, where the second electrode of the first display transistor is coupled to the pull-up node through the second anti-leakage transistor, and the second electrode of the second display transistor is coupled to the second scanning power supply terminal through the third anti-leakage transistor;

a control electrode of the first anti-leakage transistor is coupled to the pull-up node, a first electrode of the first anti-leakage transistor is coupled to the first power supply terminal, and a second electrode of the first anti-leakage transistor is coupled to an anti-leakage node;

a control electrode of the second anti-leakage transistor is coupled to the first signal input terminal, a first electrode of the second anti-leakage transistor is coupled to the second electrode of the first display transistor and the anti-leakage node, and a second electrode of the second anti-leakage transistor is coupled to the pull-up node;

a control electrode of the third anti-leakage transistor is coupled to the second signal input terminal, a first electrode of the third anti-leakage transistor is coupled to the second electrode of the second display transistor and the anti-leakage node, and a second electrode of the third anti-leakage transistor is coupled to the second scanning power supply terminal.

In some implementations, the pull-down control circuit includes: a third display transistor and a fourth display transistor;

a control electrode of the third display transistor is coupled to the first power supply terminal, a first electrode of the third display transistor is coupled to the first power supply terminal, and a second electrode of the third display transistor is coupled to the pull-down node;

a control electrode of the fourth display transistor is coupled to the pull-up node, a first electrode of the fourth display transistor is coupled to the pull-down node, and a second electrode of the fourth display transistor is coupled to the second power supply terminal.

In some implementations, the display noise reduction circuit includes: a fifth display transistor and a sixth display transistor;

a control electrode of the fifth display transistor is coupled to the first signal input terminal, a first electrode of the fifth display transistor is coupled to the pull-down node, and a second electrode of the fifth display transistor is coupled to the second scanning power supply terminal;

a control electrode of the sixth display transistor is coupled to the second signal input terminal, a first electrode of the sixth display transistor is coupled to the pull-down node, and a second electrode of the sixth display transistor is coupled to the first scanning power supply terminal.

In some implementations, the output sub-circuit includes: a seventh display transistor and an eighth display transistor;

a control electrode of the seventh display transistor is coupled to the pull-up node, a first electrode of the seventh display transistor is coupled to the output clock signal terminal, and a second electrode of the seventh display transistor is coupled to the corresponding signal output terminal;

a control electrode of the eighth display transistor is coupled to the pull-down node, a first electrode of the eighth display transistor is coupled to the corresponding signal output terminal, and a second electrode of the eighth display transistor is coupled to the reset power supply terminal.

In some implementations, the shift register further includes: a pull-up noise reduction circuit;

the pull-up noise reduction circuit includes: a ninth display transistor;

a control electrode of the ninth display transistor is coupled to the pull-down node, a first electrode of the ninth display transistor is coupled to the pull-up node, and a second electrode of the ninth display transistor is coupled to the second power supply terminal.

In some implementations, the shift register further includes: an anti-leakage circuit;

the anti-leakage circuit includes: a first anti-leakage transistor and a fourth anti-leakage transistor, where the second electrode of the ninth display transistor is coupled to the second power supply terminal through the fourth anti-leakage transistor;

a control electrode of the first anti-leakage transistor is coupled to the pull-up node, a first electrode of the first anti-leakage transistor is coupled to the first power supply terminal, and a second electrode of the first anti-leakage transistor is coupled to the anti-leakage node;

a control electrode of the fourth anti-leakage transistor is coupled to the pull-down node, a first electrode of the fourth anti-leakage transistor is coupled to the second electrode of the ninth display transistor and the anti-leakage node, and a second electrode of the fourth anti-leakage transistor is coupled to the second power supply terminal.

In some implementations, the sensing control circuit includes: a first sensing transistor;

a control electrode of the first sensing transistor is coupled to the random signal terminal, a first electrode of the first sensing transistor is coupled to the signal output terminal, and a second electrode of the first sensing transistor is coupled to the sensing control node.

In some implementations, the shift register further includes: an anti-leakage circuit;

the anti-leakage circuit includes: a fifth anti-leakage transistor and a sixth anti-leakage transistor, where the first electrode of the first sensing transistor is coupled to the signal output terminal through the sixth anti-leakage transistor;

a control electrode of the fifth anti-leakage transistor is coupled to the sensing control node, a first electrode of the fifth anti-leakage transistor is coupled to the first power supply terminal, and a second electrode of the fifth anti-leakage transistor is coupled to the first electrode of the first sensing transistor and a second electrode of the sixth anti-leakage transistor;

a control electrode of the sixth anti-leakage transistor is coupled to the random signal terminal, a first electrode of the sixth transistor is coupled to the signal output terminal, and the second electrode of the sixth transistor is coupled to the sensing control node.

In some implementations, the sensing pre-charging reset circuit includes: a second sensing transistor, a third sensing transistor and a fourth sensing transistor;

a control electrode of the second sensing transistor is coupled to the sensing control node, a first electrode of the second sensing transistor is coupled to the first clock signal terminal, and a second electrode of the second sensing transistor is coupled to a first electrode of the third sensing transistor;

a control electrode of the third sensing transistor is coupled to the first clock signal terminal, and a second electrode of the third sensing transistor is coupled to the pull-up node;

a control electrode of the fourth sensing transistor is coupled to the sensing reset signal terminal, a first electrode of the fourth sensing transistor is coupled to the pull-up node, and a second electrode of the fourth sensing transistor is coupled to the second power supply terminal.

In some implementations, the sensing pre-charging reset circuit includes: a second sensing transistor, a third sensing transistor, a fourth sensing transistor, and a fifth sensing transistor;

a control electrode of the second sensing transistor is coupled to the sensing control node, a first electrode of the second sensing transistor is coupled to the first clock signal terminal, and a second electrode of the second sensing transistor is coupled to a first electrode of the third sensing transistor and a control electrode of the fifth sensing transistor;

a control electrode of the third sensing transistor is coupled to the pull-down node, and a second electrode of the third sensing transistor is coupled to the second power supply terminal;

a control electrode of the fourth sensing transistor is coupled to the sensing reset signal terminal, a first electrode of the fourth sensing transistor is coupled to the pull-up node, and a second electrode of the fourth sensing transistor is coupled to the second power supply terminal;

a first electrode of the fifth sensing transistor is coupled to the first power supply terminal, and a second electrode of the fifth sensing transistor is coupled to the pull-up node.

In some implementations, the shift register further includes: an anti-leakage circuit;

the anti-leakage circuit includes: a first anti-leakage transistor and a seventh anti-leakage transistor, the second electrode of the fourth sensing transistor is coupled to the second power supply terminal through the seventh anti-leakage transistor;

a control electrode of the first anti-leakage transistor is coupled to the pull-up node, a first electrode of the first anti-leakage transistor is coupled to the first power supply terminal, and a second electrode of the first anti-leakage transistor is coupled to the anti-leakage node;

a control electrode of the seventh anti-leakage transistor is coupled to the sensing reset signal terminal, and a first electrode of the seventh transistor is coupled to the anti-leakage node and the second electrode of the fourth sensing transistor.

In some implementations, the shift register further includes: a sensing noise reduction circuit;

the sensing noise reduction circuit includes: a sixth sensing transistor and a seventh sensing transistor;

a control electrode of the sixth sensing transistor is coupled to the first clock signal terminal, a first electrode of the sixth sensing transistor is coupled to the pull-down node, and a second electrode of the sixth sensing transistor is coupled to a first electrode of the seventh sensing transistor;

a control electrode of the seventh sensing transistor is coupled to the sensing control node, and a second electrode of the seventh sensing transistor is coupled to the second power supply terminal.

In some implementations, the output circuit is configured with three signal output terminals, and the output circuit includes three output sub-circuits provided in one-to-one correspondence with the signal output terminals.

In a second aspect, an embodiment of the present disclosure further provides a gate driving circuit, including: N shift registers cascaded and provided by the first aspect;

first signal input terminals of the shift registers at previous m stages are coupled to a frame start signal input terminal, the first signal input terminal of the shift register at an $i^{th}$ stage is coupled to one signal output terminal of the shift register at an $(i-m)^{th}$ stage, where m is a preset positive integer, i is greater than or equal to m+1 and less than or equal to N, and i is a positive integer;

the random signal terminal of the shift register at each stage is coupled to a random signal input terminal;

second signal input terminals of the shift registers from an $(N-m)^{th}$ stage to an $N^{th}$ stage is coupled to a frame reset signal input terminal, the reset signal terminal at a $k^{th}$ stage is coupled to one signal output terminal of the shift register at a $(k+m)^{th}$ stage, k is greater than or equal to 1 and less than or equal to N-m, and k is a positive integer;

the sensing reset signal terminal of the shift register at each stage is coupled to a sensing reset signal line.

In some implementations, the shift register at each stage is configured with three corresponding signal output terminals, namely a first cascade signal output terminal, a first driving signal output terminal and a second driving signal output terminal;

the signal output terminal coupled to the sensing control circuit of the shift register at each stage is the first cascade signal output terminal corresponding to the shift register of the stage;

the first signal input terminal of the shift register at the $i^{th}$ stage is coupled to the first cascade signal output terminal of the shift register at the $(i-m)^{th}$ stage;

the second signal input terminal of the shift register at the $k^{th}$ stage is coupled to the first cascade signal output terminal of the shift register at the $(k+m)^{th}$ stage;

the first driving signal output terminal and the second driving signal output terminal of the shift register at each stage are respectively coupled to two gate lines of corresponding rows.

In some implementations, m has a value of 3.

In a third aspect, an embodiment of the present disclosure further provides a display device, including: the gate driving circuit provided in the second aspect.

In a fourth aspect, an embodiment of the present disclosure further provides a gate driving method, where the gate driving method uses the shift register provided in the first aspect, and the gate driving method includes:

in the display pre-charging stage, the display pre-charging reset circuit controls a potential of the pull-up node; the display noise reduction circuit controls a potential of the pull-down node;

in a display output stage, the output sub-circuit writes an output clock signal provided by the output clock signal terminal into the corresponding signal output terminal in response to a control of a voltage of the pull-up node in an active level state; where in the display output stage, the stage that the output clock signal is in an active level state is a sensing control stage, and in the sensing control stage, the sensing control circuit writes an output signal in an active level state output by the signal output terminal into the sensing control node in response to a control of a random signal provided by the random signal terminal;

in a display reset stage, the display pre-charging reset circuit controls the potential of the pull-up node; the display noise reduction circuit controls the potential of the pull-down node; and the output sub-circuit controls a potential of the signal output terminal according to a voltage of the pull-down node;

in a sensing pre-charging stage, the sensing pre-charging circuit writes a voltage signal in an active level state into the pull-up node in response to a voltage of the sensing control node and a control of a first clock signal provided by the first clock signal terminal;

in a sensing output stage, the output sub-circuit writes an output clock signal provided by the output clock signal terminal into the corresponding signal output terminal in response to the control of the voltage of the pull-up node in an active level state;

in a sensing reset stage, the sensing pre-charging reset circuit writes a second operating voltage in a non-active level state provided by the second power supply terminal into the pull-up node in response to a control of a sensing reset signal provided by the sensing reset signal terminal; the output sub-circuit writes a reset operating voltage in a non-active level state provided by the reset power supply terminal into the signal output terminal in response to a control of the voltage of the pull-down node in an active level state.

In some implementations, in the display pre-charging stage, the display pre-charging reset circuit writes a first scanning voltage in an active level state provided by the first scanning power supply terminal to the pull-up node in response to a control of a first input signal provided by the first signal input terminal; the display noise reduction circuit writes a second scanning voltage in a non-active level state provided by the second scanning power supply terminal into the pull-down node in response to the control of the first input signal provided by the first signal input terminal and;

in the display reset stage, the display pre-charging reset circuit writes a second scanning voltage in a non-active level state provided by the second scanning power supply terminal into the pull-up node in response to a control of a second input signal provided by the second signal input terminal; the display noise reduction circuit writes a first scanning voltage in an active level state provided by the first scanning power supply terminal into the pull-down node in response to a control of the second input signal provided by the second signal input terminal; the output sub-circuit writes the reset operating voltage in a non-active level state provided by the reset power supply terminal into the signal output terminal in response to the control of the voltage of the pull-down node in an active level state.

In some implementations, in the display pre-charging stage, the first input signal is in an active level state, the second input signal is in a non-active level state, the random signal is in a non-active level state, the first clock signal is in a non-active level state, the sensing reset signal is in a non-active level state, and the output clock signal is in a non-active level state;

in the display output stage, the first input signal is in a non-active level state, the second input signal is in a non-active level state, the random signal is in an active level state in a display active level output stage and is in a non-active level state in a display non-active level output stage, the first clock signal is in a non-active level state, the sensing reset signal is in a non-active level state, the output clock signal is in an active level state in the display active level output stage and is in a non-active level state in the display non-active level output stage;

in the display reset stage, the first input signal is in a non-active level state, the second input signal is in an active level state, the random signal is in a non-active level state, the first clock signal is in a non-active level state, the sensing reset signal is in a non-active level state, and the output clock signal is switched between a non-active level state and an active level state;

in the sensing pre-charging stage, the first input signal is in a non-active level state, the second input signal is in a non-active level state, the random signal is in a non-active level state, the first clock signal is in an active level state, the sensing reset signal is in a non-active level state, and the output clock signal is in a non-active level state;

in the sensing output stage, the first input signal is in a non-active level state, the second input signal is in a non-active level state, the random signal is in a non-active level state, the first clock signal is in a non-active level state, the sensing reset signal is in a non-active level state, the output clock signal is in an active level state in a sensing active level output stage and is in a non-active level state in a sensing non-active level output stage;

in the sensing reset stage, the first input signal is in a non-active level state, the second input signal is in a non-active level state, the random signal is in an active level state, the first clock signal is in a non-active level state, the sensing reset signal is in an active level state, and the output clock signal is in a non-active level state.

In some implementations, in the display pre-charging stage, the display pre-charging reset circuit writes the second scanning voltage in an active level state provided by the second scanning power supply terminal into the pull-up node in response to the control of the second input signal provided by the second signal input terminal; the display noise reduction circuit writes the first scanning voltage in a non-active level state provided by the first scanning power supply terminal into the pull-down node in response to the control of a second input signal provided by the second signal input terminal;

in the display reset stage, the display pre-charging reset circuit writes the first scanning voltage in a non-active level state provided by the first scanning power supply terminal into the pull-up node in response to the control of the first input signal provided by the first signal input terminal; the display noise reduction circuit writes the second scanning voltage in an active level state provided by the second scanning power supply terminal into the pull-down node in response to the control of the first input signal provided by the first signal input terminal; the output sub-circuit writes the reset operating voltage in a non-active level state provided by the reset power supply terminal into the signal output terminal in response to the control of the voltage of the pull-down node in an active level state.

In some implementations, in the display pre-charging stage, the first input signal is in a non-active level state, the second input signal is in an active level state, the random signal is in a non-active level state, the first clock signal is in a non-active level state, the sensing reset signal is in a non-active level state, and the output clock signal is in a non-active level state;

in the display output stage, the first input signal is in a non-active level state, the second input signal is in a non-active level state, the random signal is in an active level state in a display active level output stage and is in a non-active level state in a display non-active level output stage, the first clock signal is in a non-active level state, the sensing reset signal is in a non-active level state, the output clock signal is in an active level state in the display active level output stage and is in a non-active level state in the display non-active level output stage;

in the display reset stage, the first input signal is in an active level state, the second input signal is in a non-active level state, the random signal is in a non-active level state, the first clock signal is in a non-active level state, the sensing reset signal is in a non-active level state, and the output clock signal is switched between a non-active level state and an active level state;

in the sensing pre-charging stage, the first input signal is in a non-active level state, the second input signal is in a non-active level state, the random signal is in a non-active level state, the first clock signal is in an active level state, the sensing reset signal is in a non-active level state, and the output clock signal is in a non-active level state;

in the sensing output stage, the first input signal is in a non-active level state, the second input signal is in a non-active level state, the random signal is in a non-active level state, the first clock signal is in a non-active level state, the sensing reset signal is in a non-active level state, the output clock signal is in an active level state in a sensing active level output stage and is in a non-active level state in a sensing non-active level output stage;

in the sensing reset stage, the first input signal is in a non-active level state, the second input signal is in a non-active level state, the random signal is in an active level state, the first clock signal is in a non-active level state, the sensing reset signal is in an active level state, and the output clock signal is in a non-active level state.

DESCRIPTION OF EMBODIMENTS

In order to make those skilled in the art better understand technical solutions of the present disclosure, the shift register, the gate driving circuit, the display device, and the gate driving method provided in the present disclosure are described in detail below with reference to the accompanying drawings.

It should be noted that each transistor in the present disclosure may be a thin film transistor, a field effect transistor or other switching devices with the same characteristics. Each transistor generally include three electrodes: a gate electrode, a source electrode and a drain electrode, the source electrode and the drain electrode in the transistor are symmetrical in structure, and are interchangeable as required. In the present disclosure, a control electrode refers to the gate electrode of the transistor, and one of a first electrode and a second electrode is the source electrode and the other is the drain electrode.

Further, transistors may be classified into N-type transistors and P-type transistors according to transistor characteristics; when the transistor is an N-type transistor, a voltage for turning on the transistor is a high level voltage, and a voltage for turning off the transistor is a low level voltage; when the transistor is a P-type transistor, a voltage for turning on the transistor is a low level voltage, and the voltage for turning off the transistor is a high level voltage. The "active level" in the present disclosure refers to a voltage capable of controlling the corresponding transistor to be turned on, and the "non-active level" refers to a voltage capable of controlling the corresponding transistor to be turned off; thus, when the transistor is an N-type transistor, an active level refers to a high level, and an non-active level refers to a low level; when the transistor is a P-type transistor, an active level refers to a low level, and an non-active level refers to a high level.

In the following description of embodiments, the transistors are exemplified as being N-type transistors. In such case, an active level refers to a high level, and a non-active level refers to a low level. Those skilled in the art will appreciate that the transistors in the embodiments described below may also be replaced with P-type transistors.

For an OLED display panel with an external compensation function, one frame of image may be divided into two stages: a display driving stage and a sensing stage; in the display driving stage, each row of pixel circuits in the display panel complete display driving; in the sensing stage, a certain row of pixel circuits in the display panel complete a current extracting (i.e., sensing).

Figure 1:
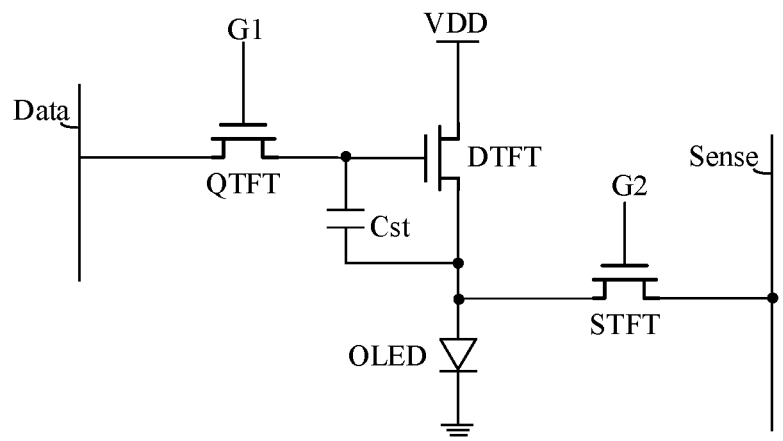
FIG. 1 is a schematic circuit diagram of a pixel circuit in an organic light emitting diode (OLED) display panel.
Figure 2:
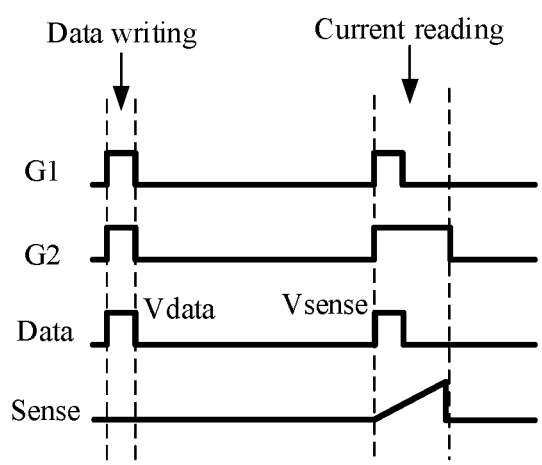
FIG. 2 is a timing diagram illustrating an operation of the pixel circuit shown in FIG. 1.

FIG. 1 is a schematic circuit diagram of a pixel circuit in an organic light emitting diode (OLED) display panel, and FIG. 2 is a timing diagram illustrating an operation of the pixel circuit shown in FIG. 1, and as shown in FIG. 1 and FIG. 2, the pixel circuit includes a display switch transistor QTFT (a control electrode thereof is coupled to a gate line G1), a driving transistor DTFT, a sensing switch transistor STFT (a control electrode thereof is coupled to a gate line G2), and a capacitor Cst. When an external compensation is needed to be performed on the pixel circuit, an operating process of the pixel circuit at least includes following two stages: a display driving stage (including a data voltage writing process) and a sensing stage (including a current reading process).

In the display driving stage, a data voltage Vdata in the data line Data needs to be written into the pixel circuit; in the sensing stage, a test voltage Vsense is written to the pixel circuit through the data line Data, and an electrical signal at a drain electrode of the driving transistor is read to a signal read line Sense through the sensing switch transistor STFT. In both the data voltage writing process and the current reading process, it is necessary to write an active level voltage to a gate electrode of the sensing switch transistor STFT through the corresponding gate line G2.

It should be noted that, the process of performing the external compensation on the pixel circuit in the OLED display panel belongs to a conventional technology in the art, and specific compensation processes and principles are not described herein again.

Since a duration of the data voltage writing process is longer than that of the current reading process, it is necessary for the gate line G2 coupled to the gate electrode of the sensing switch transistor STFT to output a double pulse signal during one frame, so that a pulse width corresponding to the current reading process is longer than that corresponding to the data voltage writing process. Therefore, it is required that the gate driving element has a function of outputting a double pulse signal with two different pulse widths.

Figure 3:
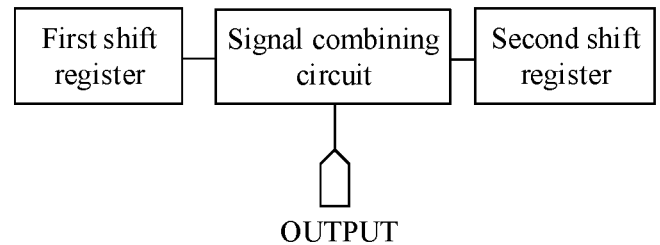
FIG. 3 is a schematic structural diagram of a gate driving element in the related art.

FIG. 3 is a schematic structural diagram of a gate driving element in the related art, and as shown in FIG. 3, in order to enable the gate driving element to output a double pulse signal, a first shift register, a second shift register and a signal combining circuit are used to form a gate driving element in the related art. In the gate driving circuit, first shift registers in all gate driving elements are cascaded, second shift registers in all gate driving elements are cascaded, each first shift register is configured to output a driving signal for driving the sensing switch transistor in the display driving stage, each second shift register is configured to output a driving signal for driving the sensing switch transistor in the sensing stage, the signal combining circuit combines driving signals output by two shift registers located in the same gate driving element as the signal combining circuit, and output a double pulse signal through a signal output terminal OUT, so as to meet driving requirements.

Although above technical solution of forming the gate driving element by two shift registers and one signal combining circuit can satisfy the driving requirements, a complex structure is resulted in, and the number of transistors to be arranged is relatively large, which is not favorable for a design of a narrow bezel.

In order to solve the above technical problem, the present disclosure provides a shift register, which has a function of outputting a double pulse signal and can meet the driving requirements of a pixel circuit in a display driving stage and a sensing stage, and thus the shift register in the present disclosure can be independently used as a gate driving element. Compared with the technical solution, in which the gate driving element including two shift register and one signal combining circuit, in the related art, the technical solution of the present disclosure can significantly reduce the number of transistors in the gate driving element, which is favorable to implement a narrow bezel.

Figure 4:
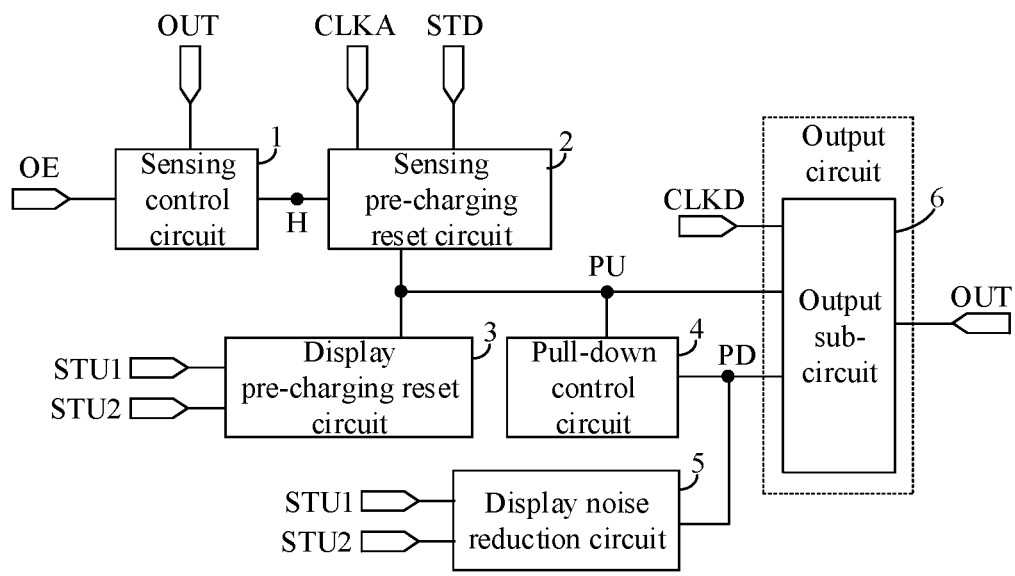
FIG. 4 is a schematic circuit diagram of a shift register according to an embodiment of the present disclosure.

FIG. 4 is a schematic circuit diagram of a shift register according to an embodiment of the present disclosure, and as shown in FIG. 4, the shift register includes: a display pre-charging reset circuit 3, a sensing control circuit 1, a sensing pre-charging reset circuit 2, a pull-down control circuit 4, a display noise reduction circuit 5 and an output circuit, the sensing control circuit 1 and the sensing pre-charging reset circuit 2 are coupled to a sensing control node H, the display pre-charging reset circuit 3, the sensing pre-charging reset circuit 2, the pull-down control circuit 4 and the output circuit are coupled to a pull-up node PU, and the pull-down control circuit 4, the display noise reduction circuit 5 and the output circuit are coupled to a pull-down node PD.

The display pre-charging reset circuit 3 is coupled to a first signal input terminal STU1, a second signal input terminal STU2, a first scanning power supply terminal D, and a second scanning power supply terminal R, and is configured to write a first scanning voltage provided by the first scanning power supply terminal D into the pull-up node PU in response to a control of the first signal input terminal STU1; and write a second scanning voltage provided by the second scanning power supply terminal R into the pull-up node PU in response to a control of the second signal input terminal STU2.

The sensing control circuit 1 is coupled to the signal output terminal OUT and a random signal terminal OE, and is configured to write an output signal provided by the signal output terminal OUT into the sensing control node H in response to a control of the random signal terminal OE.

The sensing pre-charging reset circuit 2 is coupled to a first clock signal terminal CLKA, a sensing reset signal terminal STD and a second power supply terminal, and is configured to write a voltage signal in an active level state into the pull-up node PU in response to a control of a voltage at the sensing control node H; and write a second operating voltage into the pull-up node PU in response to a control of the sensing reset signal terminal STD.

The pull-down control circuit 4 is coupled to a first power supply terminal and a second power supply terminal, and is configured to write a voltage, with a phase opposite to that of a voltage at the pull-up node PU, to the pull-down node PD.

The display noise reduction circuit 5 is coupled to the first signal input terminal STU1, the second signal input terminal STU2, the first scanning power supply terminal D, and the second scanning power supply terminal R, and is configured to write a second scanning voltage into the pull-down node PD in response to the control of the first signal input terminal STU1; and write a first scanning voltage into the pull-down node PD in response to the control of the second signal input terminal STU2.

The output circuit is provided with at least one signal output terminal OUT and includes at least one output sub-circuit 6 arranged in one-to-one correspondence with the at least one signal output terminal OUT; the output sub-circuit 6 is coupled to the pull-up node PU, the pull-down node PD, the corresponding signal output terminal OUT, a corresponding output clock signal terminal CLKD, and a reset power supply terminal, and is configured to write an output clock signal provided by the corresponding output clock signal terminal CLKD into the corresponding signal output terminal OUT in response to a control of the voltage at the pull-up node PU; and write a reset operating voltage provided by the reset power supply terminal into the corresponding signal output terminal OUT in response to a control of voltage at the pull-down node PD.

In some implementations, the at least one signal output terminal includes one to four signal output terminals. It should be noted that FIG. 4 only shows one signal output terminal by way of example, which does not limit the technical solution of the present disclosure.

As can be seen from the foregoing, it is shown in the present disclosure that the pre-charging reset circuit 3 and the sensing pre-charging reset circuit 2 can share one pull-down control circuit 4 and one output circuit.

The shift register provided by the embodiment of the present disclosure can independently constitute a gate driving element, and thus the gate driving element in the present disclosure includes: one display pre-charging reset circuit, one sensing control circuit, one sensing pre-charging reset circuit, one pull-down control circuit and one output circuit. Therefore, compared with the gate driving element in the related art, the technical solution of the present disclosure can omit at least one pull-down control circuit and one output circuit by sharing the pull-down control circuit and the output circuit; meanwhile, no signal combining circuit is required to be provided in the gate driving element in the present disclosure.

Therefore, compared with the gate driving element in the related art, the gate driving element including the shift register provided by the present disclosure can omit one pull-down control circuit, one output circuit and one signal combining circuit, so that the technical solution of the present disclosure can reduce the number of transistors in the gate driving element, and is beneficial to realize a narrow bezel.

In the embodiment of the present disclosure, the pull-down control circuit 4 can write a voltage, with a phase opposite to that of the voltage at the pull-up node PU, into the pull-down node PD in response to a control of the pull-up node PU. However, in the process of writing the voltage into the pull-down node PD by the pull-down control circuit 4, the voltage at the pull-down node PD is easily disturbed by noise to generate a drift, thereby causing an output by mistake. Therefore, the display noise reduction circuit 5 is configured in the shift register, so that the voltage with the phase opposite to that of the voltage at the pull-up node PU is continuously written into the pull-down node PD in the display pre-charging stage and the display reset stage (in the display pre-charging stage, the voltage at the pull-up node PU is at an active level, and the voltage output by the display noise reduction circuit 5 to the pull-down node PD is at a non-active level; in the display reset stage, the voltage at the pull-up node PU is at a non-active level, and the voltage output by the display noise reduction circuit 5 to the pull-down node PD is at an active level), thereby realizing noise reduction processing on the pull-down node PD to ensure stable output of the signal output terminal OUT.

In addition, the shift register provided in the embodiment of the present disclosure can support forward scanning (scanning and outputting sequentially from the shift register at a first stage to the shift register at an $N^{th}$ stage) and reverse scanning (scanning and outputting sequentially from the shift register of the $N^{th}$ stage to the shift register at the first stage) of the gate driving circuit, that is, can support bidirectional scanning of the gate driving circuit, and specific details may refer to the following description.

Figure 5:
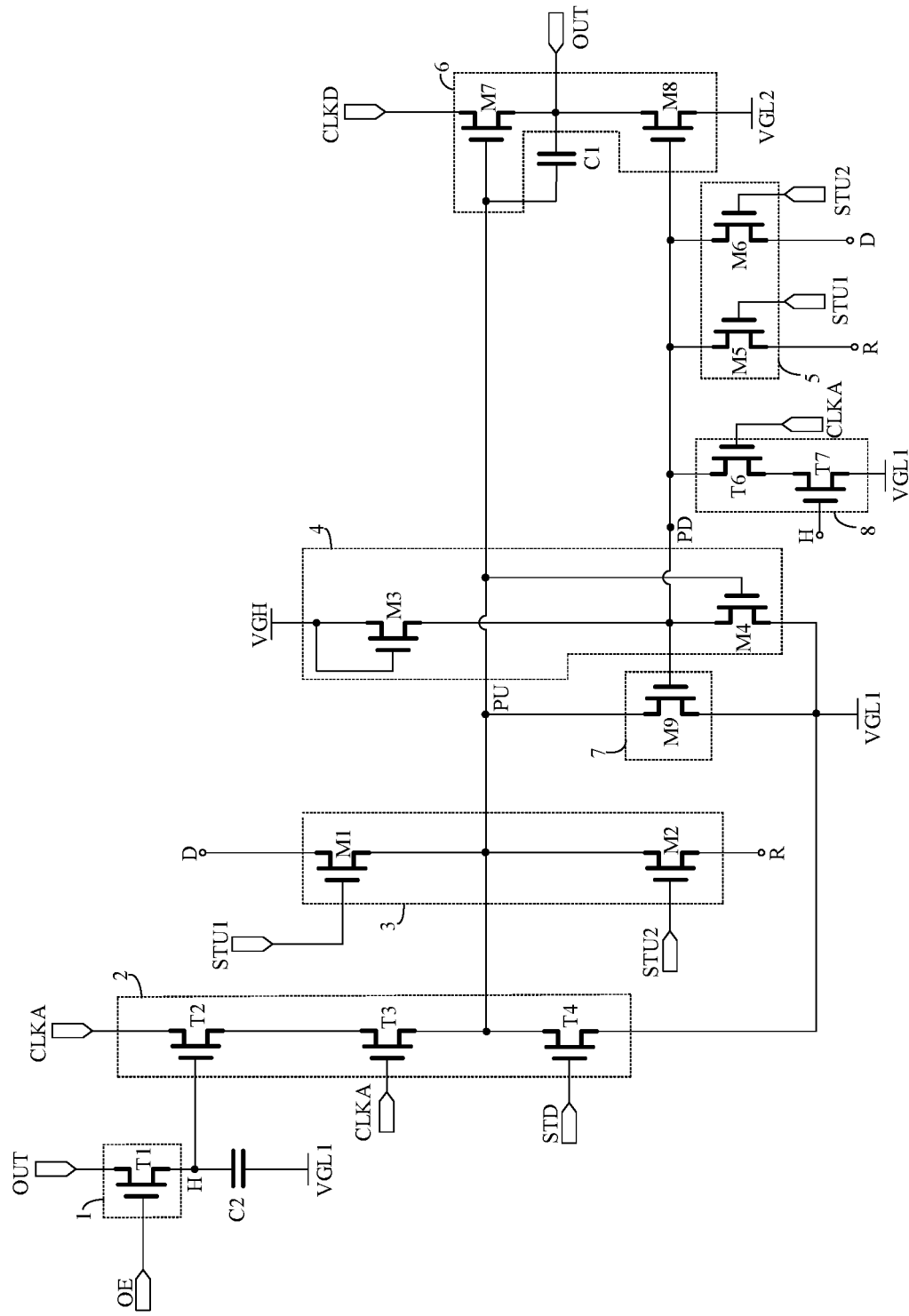
FIG. 5 is a schematic circuit diagram of a shift register according to an embodiment of the present disclosure.

FIG. 5 is a schematic circuit diagram of a shift register according to an embodiment of the present disclosure, and as shown in FIG. 5, the shift register shown in FIG. 5 is a specific implementation based on the shift register shown in FIG. 4.

In some implementations, the display pre-charging reset circuit 3 includes: a first display transistor M1 and a second display transistor M2. A control electrode of the first display transistor M1 is coupled to the first signal input terminal STU1, a first electrode of the first display transistor M1 is coupled to the first scanning power supply terminal D, and a second electrode of the first display transistor M1 is coupled to the pull-up node PU. A control electrode of the second display transistor M2 is coupled to the second signal input terminal STU2, a first electrode of the second display transistor M2 is coupled to the pull-up node PU, and a second electrode of the second display transistor M2 is coupled to the second scanning power supply terminal R.

In some implementations, the pull-down control circuit 4 includes: a third display transistor M3 and a fourth display transistor M4.

A control electrode of the third display transistor M3 is coupled to the first power supply terminal, a first electrode of the third display transistor M3 is coupled to the first power supply terminal, and a second electrode of the third display transistor M3 is coupled to the pull-down node PD. A control electrode of the fourth display transistor M4 is coupled to the pull-up node PU, a first electrode of the fourth display transistor M4 is coupled to the pull-down node PD, and a second electrode of the fourth display transistor M4 is coupled to the second power supply terminal.

In some implementations, the display noise reduction circuit 5 includes: a fifth display transistor M5 and a sixth display transistor M6. A control electrode of the fifth display transistor M5 is coupled to the first signal input terminal STU1, a first electrode of the fifth display transistor M5 is coupled to the pull-down node PD, and a second electrode of the fifth display transistor M5 is coupled to the second scanning power supply terminal R. A control electrode of the sixth display transistor M6 is coupled to the second signal input terminal STU2, a first electrode of the sixth display transistor M6 is coupled to the pull-down node PD, and a second electrode of the sixth display transistor M6 is coupled to the first scanning power supply terminal D.

In some implementations, the output sub-circuit 6 includes: a seventh display transistor M7 and an eighth display transistor M8. A control electrode of the seventh display transistor M7 is coupled to the pull-up node PU, a first electrode of the seventh display transistor M7 is coupled to the output clock signal terminal CLKD, and a second electrode of the seventh display transistor M7 is coupled to the corresponding signal output terminal OUT.

A control electrode of the eighth display transistor M8 is coupled to the pull-down node PD, a first electrode of the eighth display transistor M8 is coupled to the corresponding signal output terminal OUT, and a second electrode of the eighth display transistor M8 is coupled to the reset power supply terminal.

In some implementations, the shift register in the embodiment of the present disclosure further includes: a first capacitor C1, a first electrode of the first capacitor C1 is coupled to the pull-up node PU, and a second electrode of the first capacitor C1 is coupled to the signal output terminal OUT. The first capacitor C1 can be configured to ensure that the voltage of the pull-up node PU is always in an active level state during the display output stage and the sensing output stage.

In some implementations, the sensing control circuit 1 includes: a first sensing transistor T1; a control electrode of the first sensing transistor T1 is coupled to the random signal terminal OE, a first electrode of the first sensing transistor T1 is coupled to the signal output terminal OUT, and a second electrode of the first sensing transistor T1 is coupled to the sensing control node H.

In some implementations, the sensing pre-charging reset circuit 2 includes: a second sensing transistor T2, a third sensing transistor T3, and a fourth sensing transistor T4. A control electrode of the second sensing transistor T2 is coupled to the sensing control node H, a first electrode of the second sensing transistor T2 is coupled to the first clock signal terminal CLKA, and a second electrode of the second sensing transistor T2 is coupled to a first electrode of the third sensing transistor T3. A control electrode of the third sensing transistor T3 is coupled to the first clock signal terminal CLKA, and a second electrode of the third sensing transistor T3 is coupled to the pull-up node PU. A control electrode of the fourth sensing transistor T4 is coupled to the sensing reset signal terminal STD, a first electrode of the fourth sensing transistor T4 is coupled to the pull-up node PU, and a second electrode of the fourth sensing transistor T4 is coupled to the second power supply terminal.

In some implementations, to maintain the voltage at the sensing control node H stable, the shift register further includes: a second capacitor C2, a first electrode of the second capacitor C2 is coupled to the sensing control node H, and a second electrode of the second capacitor C2 is coupled to the second power supply terminal.

In order to facilitate better understanding the technical solutions of the present disclosure, the operation of the shift register shown in FIG. 5 will be described in detail below with reference to the accompanying drawings. The first scanning voltage provided by the first scanning power supply terminal D is a high level voltage VGH, the second scanning voltage provided by the second scanning power supply terminal R is a low level voltage VGL1, the first operating voltage provided by the first power supply terminal is a high level voltage VGH, the second operating voltage provided by the second power supply terminal is a low level operating voltage VGL1, and the reset operating voltage provided by the reset power supply terminal is a low level operating voltage VGL2.

Figure 6A:
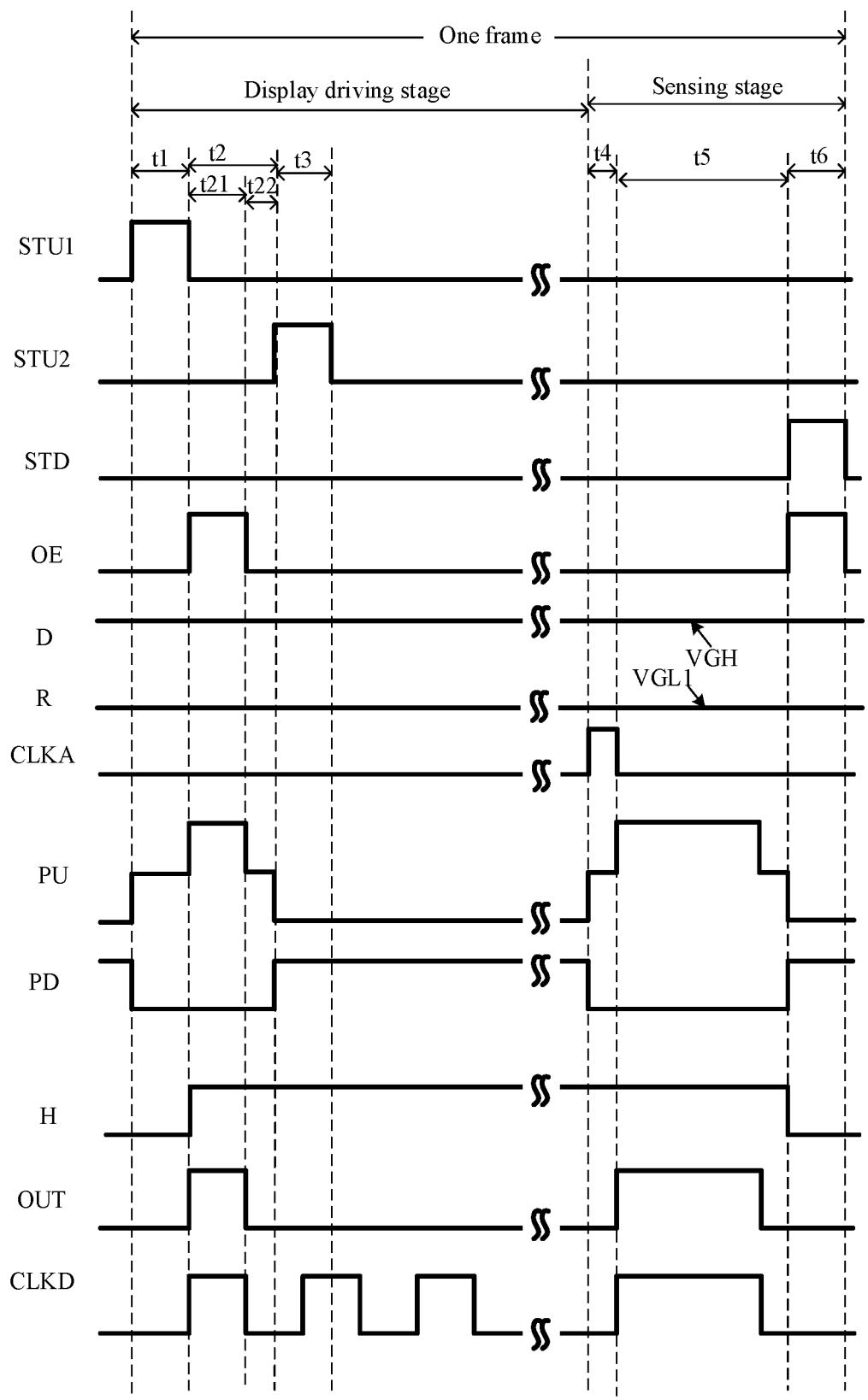
FIG. 6a is a timing diagram illustrating an operation of the shift register shown in FIG. 5 when the gate driving circuit performs a forward scanning.

FIG. 6a is a timing diagram illustrating an operation of the shift register shown in FIG. 5 corresponding to the gate driving circuit performing forward scanning, and as shown in FIG. 6a, an operation timing of the shift register when the gate driving circuit performs forward scanning is shown. The process of the operation of the shift register includes following six stages, including a display pre-charging stage t1, a display output stage t2, a display reset stage t3, a sensing pre-charging stage t4, a sensing output stage t5 and a sensing reset stage t6.

In the display pre-charging stage t1, the first input signal provided by the first signal input terminal STU1 is in a high level state, the second input signal provided by the second signal input terminal STU2 is in a low level state, the random signal provided by the random signal terminal OE is in a low level state, the first clock signal provided by the first clock signal terminal CLKA is in a low level state, the sensing reset signal provided by the sensing reset signal terminal STD is in a low level state, and the output clock signal provided by the output clock signal terminal CLKD is in a low level state.

Since the first input signal is in a high level state and the second input signal is in a low level state, the first display transistor M1 is turned on and the second display transistor M2 is turned off, the first scanning voltage VGH can be written into the pull-up node PU through the first display transistor M1, and the voltage of the pull-up node PU is in a high level state.

Since the voltage of the pull-up node PU is in a high level state, the fourth display transistor M4 and the seventh display transistor M7 are turned on, the second operating voltage VGL1 is written into the pull-down node PD through the fourth display transistor M4, and in such case, the third display transistor M3 is equivalent to a resistor, the voltage of the pull-down node PD is in a low level state, and the eighth display transistor M8 is turned off. Meanwhile, since the first input signal is in a high level state, the fifth display transistor M5 is turned on, and the second scanning voltage VGL1 is written into the pull-down node PD through the fifth display transistor M5, so as to perform noise reduction on the pull-down node PD.

Since the seventh display transistor M7 is turned on, the output clock signal can be written into the corresponding signal output terminal OUT through the seventh display transistor M7, and since the output clock signal is in a low level state, the signal output terminal OUT outputs a low level signal.

Since the random signal is in a low level state, the first sensing transistor T1 is turned off, the sensing control node H is in a floating state, and the voltage of the sensing control node H maintains at the low level state of the previous stage, and in such case, the second sensing transistor T2, the third sensing transistor T3, and the fourth sensing transistor T4 are all turned off. Since the first sensing transistor T1 is turned off, the output signal does not affect the voltage of the sensing control node H regardless of whether the output signal is in the high level state or the low level state.

The display output stage t2 includes: a display active level output stage t21 (which may also be referred to as a sensing control stage) and a display non-active level output stage t22. In the display output stage t2, the first input signal provided by the first signal input terminal STU1 is in a low level state, the second input signal provided by the second signal input terminal STU2 is in a low level state, the random signal provided by the random signal terminal OE is in a high level state in the display active level output stage t21 and in a low level state in the display non-active level output stage t22, the first clock signal provided by the first clock signal terminal CLKA is in a low level state, the sensing reset signal provided by the sensing reset signal terminal STD is in a low level state, the output clock signal provided by the output clock signal terminal CLKD is in a high level state in the display active level output stage t21 and in a low level state in the display non-active level output stage t22.

Since the first input signal is in a low level state and the second input signal is in a low level state, the first display transistor M1 and the second display transistor M2 are both turned off, and the pull-up node PU is in a floating state. The fourth display transistor M4 is continuously turned on, the pull-down node PD maintains in a low level state, and the eighth display transistor M8 maintains to be turned off.

Since the output clock signal is switched from the low level state to the high level state just after the display active level output stage t21 is entered, the signal output terminal OUT outputs a high level signal. In such case, the voltage of the pull-up node PU is pulled up to a higher state under bootstrap action of the first capacitor C1. In the embodiment, assuming that the voltage corresponding to each clock signal is VGH when the clock signal is at a high level, and is VGL (approximately 0V) when the clock signal is at a low level, the voltage of the pull-up node PU is approximately VGH in the display pre-charging stage t1, and the voltage of the pull-up node PU can be pulled up to approximately 2×VGH at an initial time of the display active level output stage t21.

When the display active level output stage t21 ends and the display non-active level output stage t22 is entered, the output clock signal is switched from a high level state to a low level state, and the signal output terminal OUT outputs a low level signal; meanwhile, under bootstrap action of the first capacitor C1, the voltage of the pull-up node PU drops to a level at an initial time of the display driving stage, i.e., drops to VGH, at which the pull-up node PU is still in the high level state, and the seventh display transistor M7 remains turned on.

It should be noted that, when the display active level output stage t21 (corresponding to the sensing control stage) is entered, the first sensing transistor T1 is turned on because the random signal is in the high level state. In such case, since the signal output terminal OUT outputs a high level signal, the high level signal can be written into the sensing control node H through the first sensing transistor T1, and the voltage at the sensing control node H is in a high level state. In such case, the second sensing transistor T2 is turned on, and the first clock signal can be written into the first electrode of the third sensing transistor T3 through the second sensing transistor T2. However, since the first clock signal is in a low level state, the third sensing transistor T3 is turned off. At the end of the display active level output stage t21, since the random signal changes to be in a low level state, the first sensing transistor T1 is turned off, and the sensing control node H is in a floating state. The voltage at the sensing control node H can be maintained in a high level state by the second capacitor C2.

In the display reset stage t3, the first input signal provided by the first signal input terminal STU1 is in a low level state, the second input signal provided by the second signal input terminal STU2 is in a high level state, the random signal provided by the random signal terminal OE is in a low level state, the first clock signal provided by the first clock signal terminal CLKA is in a low level state, the sensing reset signal provided by the sensing reset signal terminal STD is in a low level state, and the output clock signal provided by the output clock signal terminal CLKD is switched between a low level state and a high level state.

Since the second input signal is in a high level state, the second display transistor M2 is turned on, the second scanning voltage VGL1 is written into the pull-up node PU through the second display transistor M2, and the pull-up node PU is in a low level state, so that both the fourth display transistor M4 and the seventh display transistor M7 are turned off. In such case, the first operating voltage VGH is written into the pull-down node PD through the third display transistor M3, the pull-down node PD is in a high level state, and the eighth display transistor M8 is turned on. Meanwhile, since the second input signal is in a high level state, the sixth display transistor M6 is turned on, and the first scanning voltage VGH is written into the pull-down node PD through the sixth display transistor M6, so as to perform noise reduction processing on the pull-down node PD.

Since the eighth display transistor M8 is turned on, the reset operating voltage VGL2 is written into the signal output terminal OUT through the eighth display transistor M8, and the signal output terminal OUT outputs a low level signal, that is, the display reset is completed.

In the display reset stage T3, since the random signal and the first clock signal clock are always in the low level state, the first sensing transistor T1 and the third sensing transistor T3 are always maintained to be turned off. Since the sensing control node H is always in the high level state, the second sensing transistor T2 is always maintained to be turned off. Since the sensing reset signal is in a low level state, the fourth sensing transistor T4 is always maintained to be turned off.

In a stage from an end of the display reset stage t3 to a beginning of the sensing pre-charging stage t4, the transistors in the pixel circuit remain in states in the display reset stage t3.

In the sensing pre-charging stage t4, the first input signal provided by the first signal input terminal STU1 is in a low level state, the second input signal provided by the second signal input terminal STU2 is in a low level state, the random signal provided by the random signal terminal OE is in a low level state, the first clock signal provided by the first clock signal terminal CLKA is in a high level state, the sensing reset signal provided by the sensing reset signal terminal STD is in a low level state, and the output clock signal provided by the output clock signal terminal CLKD is in a low level state.

Since the random signal is in a low level state, the first sensing transistor T1 is turned off, the sensing control node H is in a floating state and is maintained in the high level state of the previous stage, the second sensing transistor T2 is turned on, and the first clock signal in the high level state is written into the first electrode of the third sensing transistor T3 through the second sensing transistor T2. Further, since the first clock signal is in a high level state, the third sensing transistor T3 is turned on, and the first clock signal in the high level state can be written into the pull-up node PU through the third sensing transistor T3, and the pull-up node PU is in the high level state.

Since the voltage of the pull-up node PU is in a high level state, the fourth display transistor M4 and the seventh display transistor M7 are turned on, the second operating voltage VGL1 is written into the pull-down node PD through the fourth display transistor M4, and in such case, the third display transistor M3 is equivalent to a resistor, the voltage of the pull-down node PD is in a low level state, and the eighth display transistor M8 is turned off.

Since the seventh display transistor M7 is turned on, the output clock signal can be written into the corresponding signal output terminal OUT through the seventh display transistor M7, and since the output clock signal is in a low level state, the signal output terminal OUT outputs a low level signal.

The sensing output stage t5 includes: a sensing active level output stage and a sensing non-active level output stage. In the sensing output stage t5, the first input signal provided by the first signal input terminal STU1 is in a low level state, the second input signal provided by the second signal input terminal STU2 is in a low level state, the random signal provided by the random signal terminal OE is in a low level state, the first clock signal provided by the first clock signal terminal CLKA is in a low level state, the sensing reset signal provided by the sensing reset signal terminal STD is in a low level state, and the output clock signal provided by the output clock signal terminal CLKD is in a high level state in the sensing active level output stage and in a low level state in the sensing non-active level output stage.

Since the random signal is in the low level state, the first sensing transistor T1 is turned off, the sensing control node H is in a floating state and is maintained in the high level state of the previous stage, the second sensing transistor T2 is turned on, and the first clock signal in the low level state is written into the first electrode of the third sensing transistor T3 through the second sensing transistor T2. Further, since the first clock signal is in a low level state, the third sensing transistor T3 is turned off. Meanwhile, since the sensing reset signal is in a low level state, the fourth sensing transistor T4 is turned off.

Since the first input signal is in a low level state and the second input signal is in a low level state, the first display transistor M1 and the second display transistor M2 are both turned off, and the pull-up node PU is in a floating state. The fourth display transistor M4 is continuously turned on, the pull-down node PD maintains in a low level state, and the eighth display transistor M8 maintains to be turned off.

Since the output clock signal is switched from a low level state to a high level state when the sensing active level output stage is just entered, the signal output terminal OUT outputs a high level signal. In such case, the voltage of the pull-up node PU is pulled up to a higher state under bootstrap action of the first capacitor C1. In the embodiment, assuming that the voltage corresponding to each clock signal is VGH when the clock signal is at a high level, and is VGL (approximately 0V) when the clock signal is at a low level, the voltage of the pull-up node PU is approximately VGH during the display pre-charging stage t1, and the voltage of the pull-up node PU can be pulled up to approximately 2×VGH at an initial time of the sensing active level output stage.

In a stage from an end of the sensing active level output stage to a beginning of the sensing non-active level output stage, the output clock signal is switched from a high level state to a low level state, and then the signal output terminal OUT outputs a low level signal; meanwhile, under bootstrap action of the first capacitor C1, the voltage of the pull-up node PU drops to a level at an initial time of the display driving stage, i.e., drops to VGH, at which the pull-up node PU is still in the high level state, and the seventh display transistor M7 remains turned on.

In the sensing reset stage t6, the first input signal provided by the first signal input terminal STU1 is in a low level state, the second input signal provided by the second signal input terminal STU2 is in a low level state, the random signal provided by the random signal terminal OE is in a high level state, the first clock signal provided by the first clock signal terminal CLKA is in a low level state, the sensing reset signal provided by the sensing reset signal terminal STD is in a high level state, and the output clock signal provided by the output clock signal terminal CLKD is in a low level state.

Since the sensing reset signal is in a high level state, the fourth sensing transistor T4 is turned on, the second operating voltage VGL1 is written into the pull-up node PU through the fourth sensing transistor T4, the pull-up node PU is in a low level state, and both the fourth display transistor M4 and the seventh display transistor M7 are turned off. In such case, the first operating voltage VGH is written into the pull-down node PD through the third display transistor M3, the pull-down node PD is in a high level state, and the eighth display transistor M8 is turned on. Meanwhile, since the eighth display transistor M8 is turned on, the reset operating voltage VGL2 is written into the signal output terminal OUT through the eighth transistor, and the signal output terminal OUT outputs a low level signal, that is, the sensing reset is completed.

In the sensing reset stage T6, since the random signal is in the high level state, the first sensing transistor T1 is turned on, the low level signal output by the signal output terminal OUT is written into the sensing control node H through the first sensing transistor T1, the sensing control node H is in the low level state, and the second sensing transistor T2 is turned off.

Figure 6B:
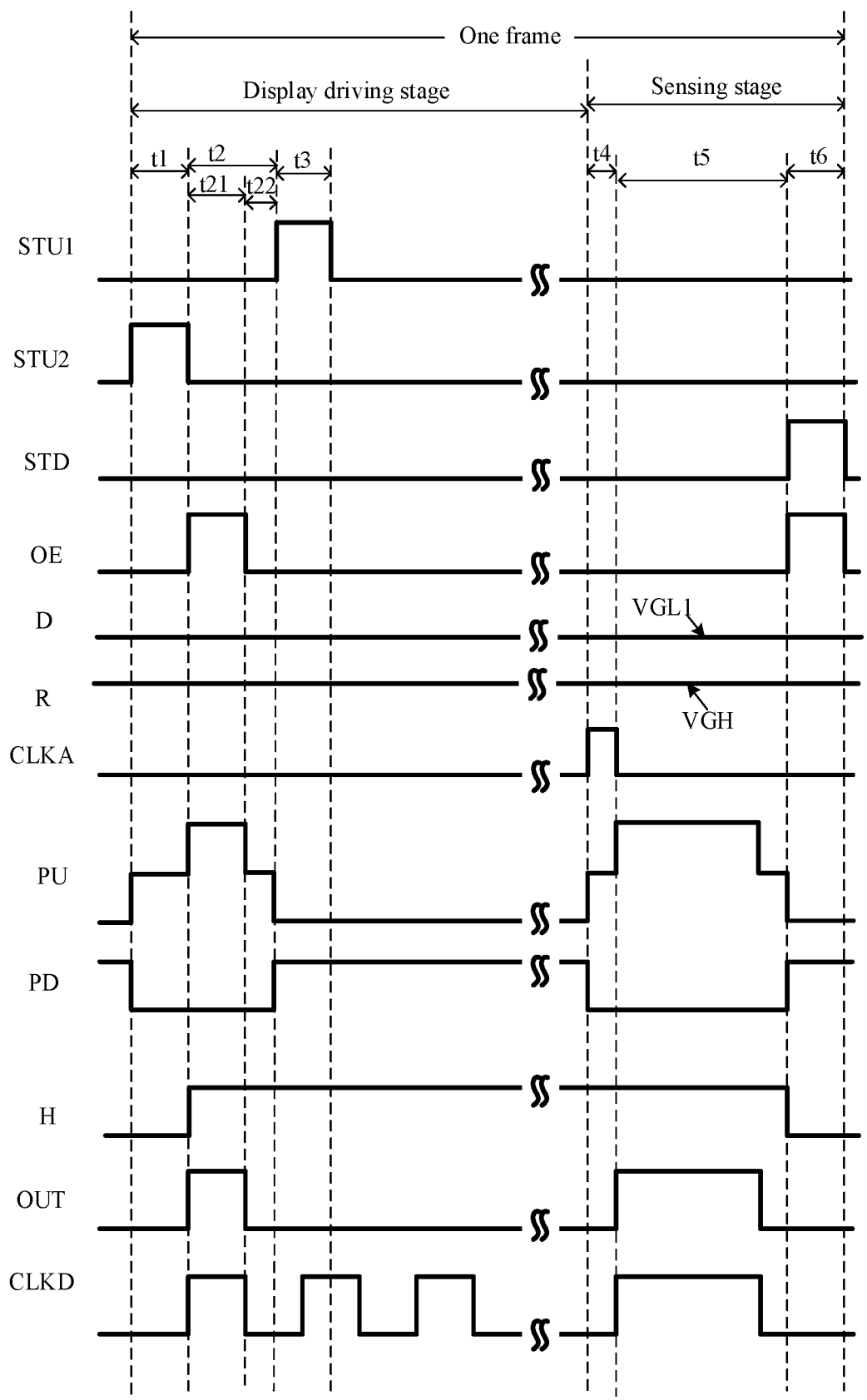
FIG. 6b is a timing diagram illustrating operation of the shift register of FIG. 5 when the gate driving circuit performs a reverse scanning.

FIG. 6b is a timing diagram illustrating an operation of the shift register shown in FIG. 5 corresponding to the gate driving circuit performing reverse scanning, and shown in FIG. 6b, an operation timing of the shift register when the gate driving circuit performs reverse scanning is shown. The first scanning voltage provided by the first scanning power supply terminal D is a low level voltage VGL1, the second scanning voltage provided by the second scanning power supply terminal R is a high level voltage VGH, the first operating voltage provided by the first power supply terminal is a high level voltage VGH, the second operating voltage provided by the second power supply terminal is a low level operating voltage VGL1, and the reset operating voltage provided by the reset power supply terminal is a low level operating voltage VGL2.

Unlike the timing diagram of FIG. 6a, in the timing diagram of FIG. 6b, in the display pre-charging stage t1, the first input signal provided by the first signal input terminal STU1 is in a low level state, the second input signal provided by the second signal input terminal STU2 is in a high level state, the first display transistor M1 is turned off, the second display transistor M2 is turned on, and the second scanning voltage VGH is written into the pull-up node PU through the second display transistor M2 to pre-charge the pull-up node PU. In the display reset stage t3, the first input signal provided by the first signal input terminal STU1 is in a high level state, the second input signal provided by the second signal input terminal STU2 is in a low level state, the first display transistor M1 is turned on, the second display transistor M2 is turned off, and the first scanning voltage VGL1 is written into the pull-up node PU through the first display transistor M1, so as to reset the pull-up node PU.

For the specific process of the operation of the shift register at each stage when the gate driving circuit performs the reverse scanning, reference may be made to the corresponding content in the foregoing embodiment, and details are not described here again.

Based on the above, it can be seen that the shift register provided in the embodiment of the present disclosure can support bidirectional scanning of the gate driver circuit.

In some implementations, the shift register of the embodiment of the present disclosure further includes: a pull-up noise reduction circuit; the pull-up noise reduction circuit includes a ninth display transistor M9, a control electrode of the ninth display transistor M9 is coupled to the pull-down node PD, a first electrode of the ninth display transistor M9 is coupled to the pull-up node PU, and a second electrode of the ninth display transistor M9 is coupled to the second power supply terminal. The pull-up noise reduction circuit is configured to write a second operating voltage in a non-active level state into the pull-up node PU when the voltage of the pull-down node PD is in an active level state, so as to perform noise reduction processing on the pull-up node PU; the pull-up noise reduction circuit is not a necessary structure in the present embodiment.

In some implementations, the shift register of the embodiment of the present disclosure further includes: a sensing noise reduction circuit; the sensing noise reduction circuit includes: a sixth sensing transistor T6 and a seventh sensing transistor T7. A control electrode of the sixth sensing transistor T6 is coupled to the first clock signal terminal CLKA, a first electrode of the sixth sensing transistor T6 is coupled to the pull-down node PD, and a second electrode of the sixth sensing transistor T6 is coupled to a first electrode of the seventh sensing transistor T7; a control electrode of the seventh sensing transistor T7 is coupled to the sensing control node H, and a second electrode of the seventh sensing transistor T7 is coupled to the second power supply terminal. In the sensing pre-charging stage t4, the first clock signal and the sensing control node H are both in a high level state, and the second operating voltage VGL1 can be written into the pull-down node PD through the seventh sensing transistor T7 and the sixth sensing transistor T6 to reduce noise of the pull-down node PD. The sensing noise reduction circuit is not a necessary structure in the present embodiment.

Figure 7:
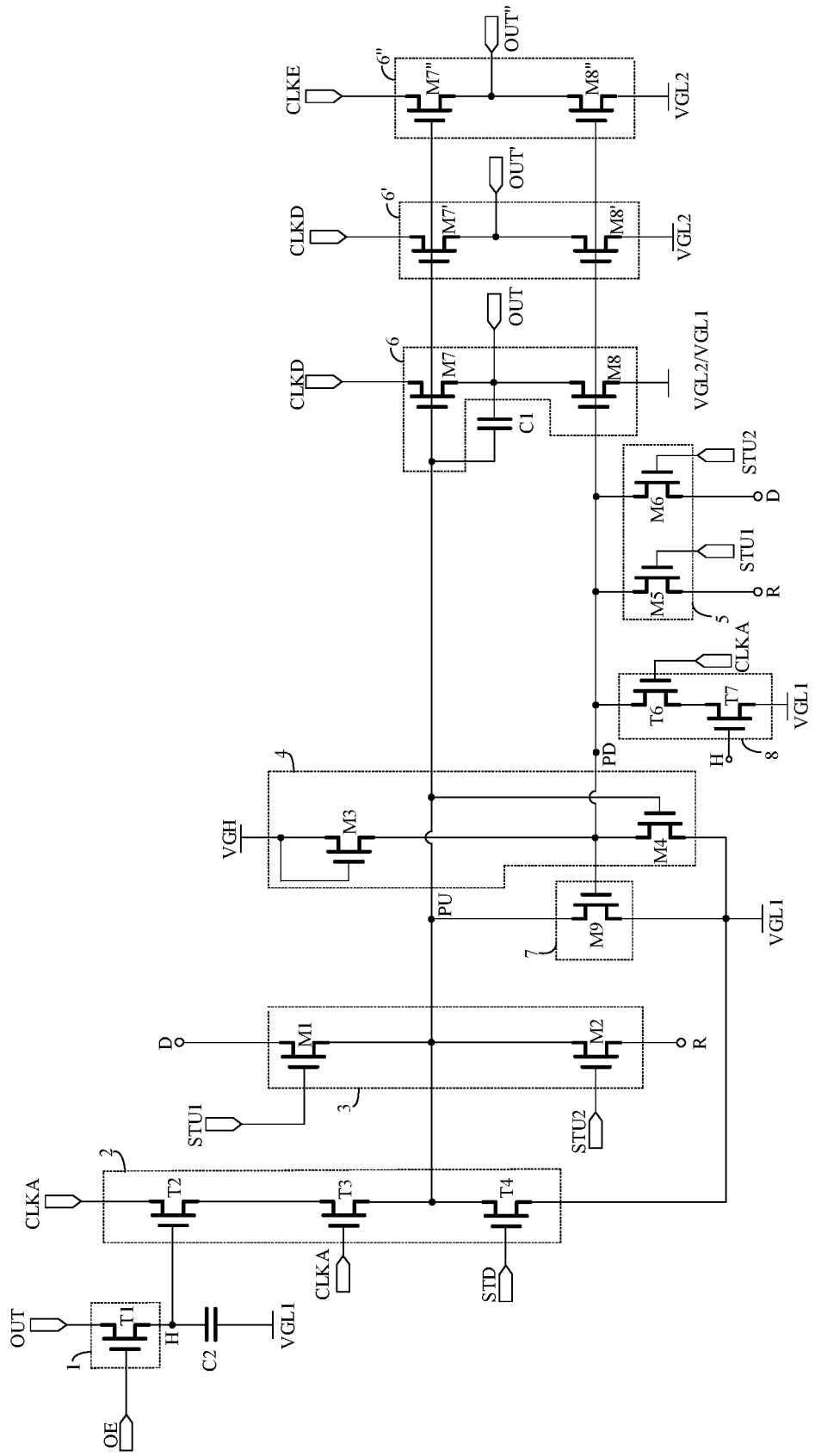
FIG. 7 is a schematic circuit diagram of a shift register according to an embodiment of the present disclosure.
Figure 8:
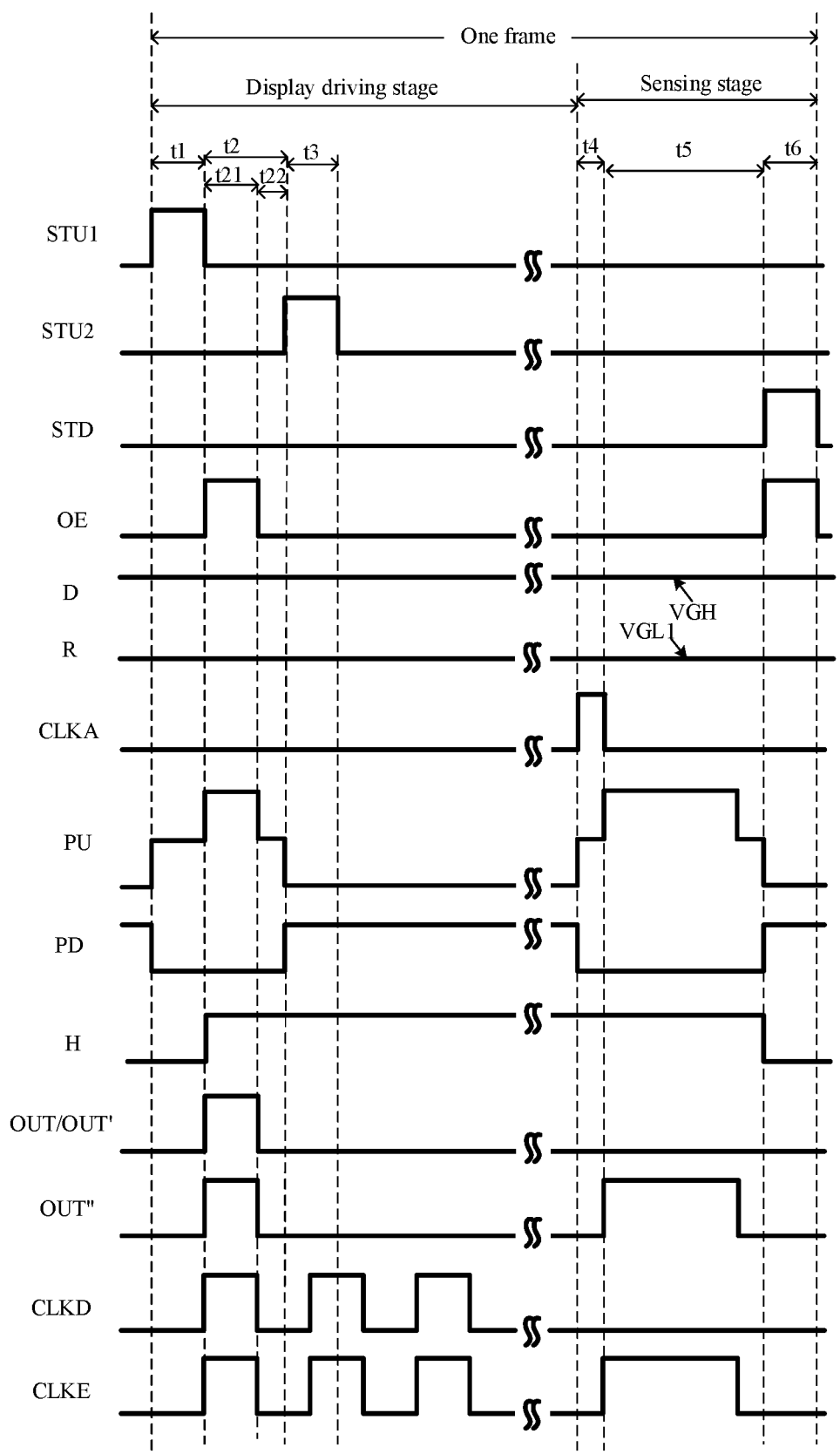
FIG. 8 is a timing diagram illustrating an operation of the shift register shown in FIG. 7.

FIG. 7 is another schematic circuit diagram of a shift register according to an embodiment of the present disclosure, and FIG. 8 is a timing diagram illustrating an operation of the shift register shown in FIG. 7, and as shown in FIG. 7 and FIG. 8, different from that in the shift register shown in FIG. 5, in this embodiment, three signal output terminals are included, that is, signal output terminals OUT, OUT' and OUT" are included, and correspondingly, three output sub-circuits are included, that is, output sub-circuits 6, 6' and 6" are included. The seventh display transistors M7, M7' and M7" in the respective output sub-circuits 6, 6' and 6" are simultaneously turned on or off, and the eighth display transistors M8, M8' and M8" in the respective output sub-circuits 6, 6' and 6" are simultaneously turned on or off.

In the shift register shown in FIG. 7, the second electrode of the eighth display transistor M8 may be coupled to the second power supply terminal, instead of the reset power supply terminal.

The process of the operation of the shift register shown in FIG. 7 is the same as that of the shift register shown in FIG. 5, and specific contents can be referred to the foregoing contents, which are not described again here.

In some implementations, the output sub-circuit 6 and the output sub-circuit 6' are both coupled to the output clock signal terminal CLKD, and the output sub-circuit 6" is coupled to an output clock signal terminal CLKE; the signal output terminal OUT of the three signal output terminals is configured to provide an input signal to the sensing control circuit 1 and provide a cascade signal to another shift register in the gate driving circuit; the other two signal output terminals OUT' and OUT" are respectively configured to provide driving signals to the gate line G1 coupled to the control electrode of the display switch transistor QTFT and the gate line G2 coupled to the control electrode of the sensing switch transistor STFT in the corresponding row of pixel circuits (the timing of the output clock signal terminal CLKD corresponding to the signal output terminal OUT' and the timing of the output clock signal terminal CLKE corresponding to the signal output terminal OUT" can be seen in FIG. 8).

It should be noted that, in the technical solution of the present disclosure, the number of the signal output terminals and the output sub-circuits is not limited, and output clock signals loaded in the output clock signal terminals coupled to the output sub-circuits are also not limited, that is, the output clock signals loaded in the output clock signal terminals may be the same or different.

Figure 9:
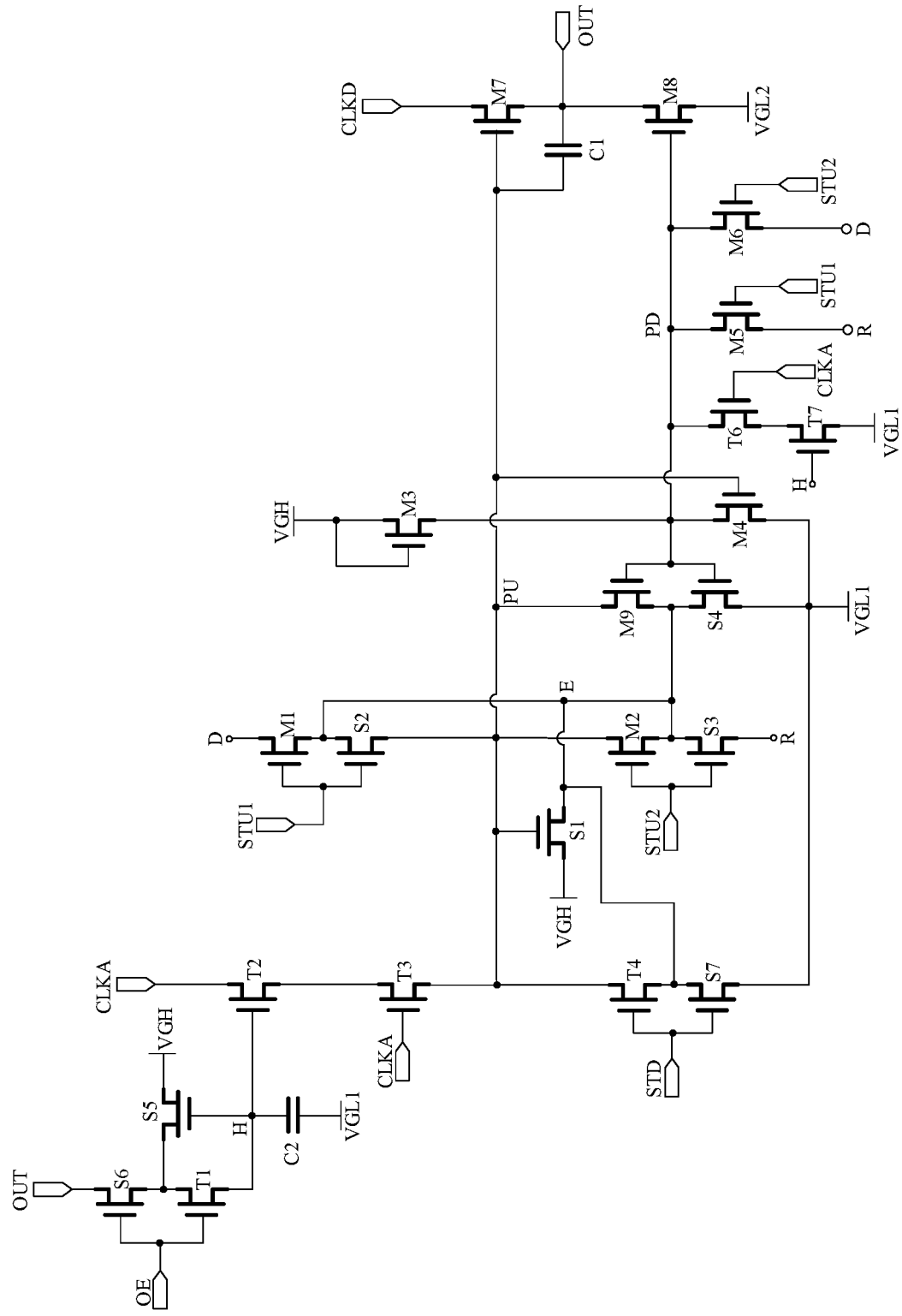
FIG. 9 is a schematic circuit diagram of a shift register according to an embodiment of the present disclosure.

FIG. 9 is another schematic circuit diagram of a shift register according to an embodiment of the present disclosure, and as shown in FIG. 9, unlike the shift registers shown in FIGS. 5 and 7, an anti-leakage circuit is disposed in the shift register shown in FIG. 9.

In some implementations, the anti-leakage circuit includes: a first anti-leakage transistor S1, a second anti-leakage transistor S2, a third anti-leakage transistor S3, a fourth anti-leakage transistor S4, a fifth anti-leakage transistor S5, a sixth anti-leakage transistor S6, and a seventh anti-leakage transistor S7. The second electrode of the first display transistor M1 is coupled to the pull-up node PU through the second anti-leakage transistor S2, the second electrode of the second display transistor M2 is coupled to the second scanning power supply terminal R through the third anti-leakage transistor S3, the second electrode of the ninth display transistor M9 is coupled to the second power supply terminal through the fourth anti-leakage transistor S4, the first electrode of the first sensing transistor T1 is coupled to the signal output terminal OUT through the sixth anti-leakage transistor S6, and the second electrode of the fourth sensing transistor T4 is coupled to the second power supply terminal through the seventh anti-leakage transistor S7.

A control electrode of the first anti-leakage transistor S1 is coupled to the pull-up node PU, a first electrode of the first anti-leakage transistor S1 is coupled to the first power supply terminal, and a second electrode of the first anti-leakage transistor S1 is coupled to an anti-leakage node E.

A control electrode of the second anti-leakage transistor S2 is coupled to the first signal input terminal STU1, a first electrode of the second anti-leakage transistor S2 is coupled to the second electrode of the first display transistor M1 and the anti-leakage node E, and a second electrode of the second anti-leakage transistor S2 is coupled to the pull-up node PU.

A control electrode of the third anti-leakage transistor S3 is coupled to the second signal input terminal STU2, a first electrode of the third anti-leakage transistor S3 is coupled to the second electrode of the second display transistor M2 and the anti-leakage node E, and a second electrode of the third anti-leakage transistor S3 is coupled to the second scanning power supply terminal R.

A control electrode of the fourth anti-leakage transistor S4 is coupled to the pull-down node PD, a first electrode of the fourth anti-leakage transistor S4 is coupled to the second electrode of the ninth display transistor M9 and the anti-leakage node E, and a second electrode of the fourth anti-leakage transistor S4 is coupled to the second power supply terminal.

A control electrode of the fifth anti-leakage transistor S5 is coupled to the sensing control node H, a first electrode of the fifth anti-leakage transistor S5 is coupled to the first power supply terminal, and a second electrode of the fifth anti-leakage transistor S5 is coupled to the first electrode of the first sensing transistor T1 and a second electrode of the sixth anti-leakage transistor S6.

A control electrode of the sixth anti-leakage transistor S6 is coupled to the random signal terminal OE, a first electrode of the sixth anti-leakage transistor S6 is coupled to the signal output terminal OUT, and the second electrode of the sixth anti-leakage transistor S6 is coupled to the first electrode of the first sensing transistor T1.

A control electrode of the seventh anti-leakage transistor S7 is coupled to the sensing reset signal terminal STD, a first electrode of the seventh anti-leakage transistor S7 is coupled to the anti-leakage node E and the second electrode of the fourth sensing transistor T4, and a second electrode of the seventh anti-leakage transistor S7 is coupled to the second power supply terminal.

By providing the first through seventh anti-leakage transistors S1 through S7, the first display transistor M1, the second display transistor M2, the ninth display transistor M9, the first sensing transistor T1, and the fourth sensing transistor T4 can be effectively prevented from generating leakage current.

Figure 10:
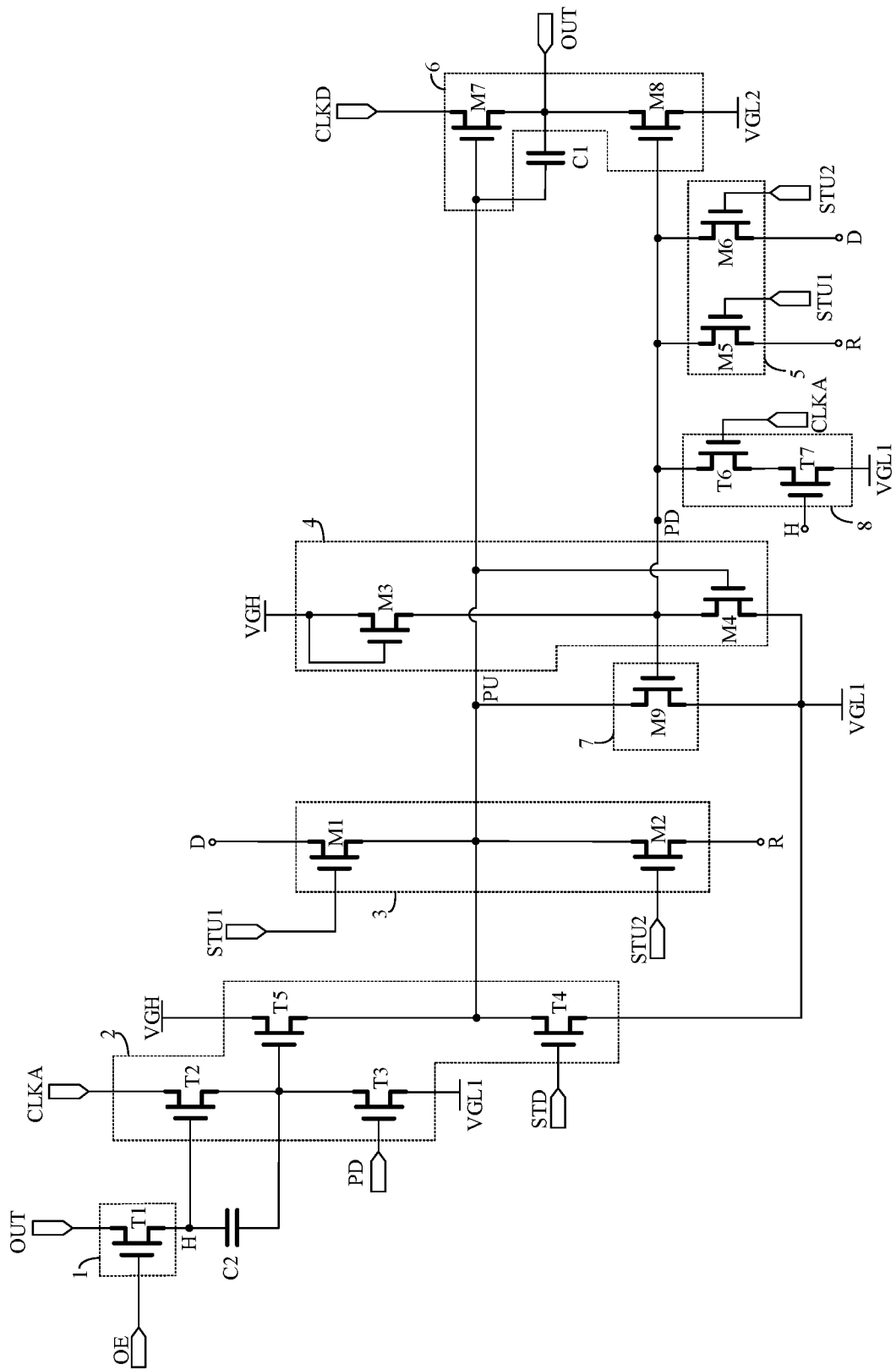
FIG. 10 is a schematic circuit diagram of a shift register according to an embodiment of the present disclosure.

FIG. 10 is another schematic circuit diagram of a shift register according to an embodiment of the present disclosure, and as shown in FIG. 10, unlike the shift register described above, the sensing pre-charging reset circuit 2 in the shift register shown in FIG. 10 includes: a second sensing transistor T2, a third sensing transistor T3, a fourth sensing transistor T4, and a fifth sensing transistor T5.

A control electrode of the second sensing transistor T2 is coupled to the sensing control node H, a first electrode of the second sensing transistor T2 is coupled to the first clock signal terminal CLKA, and a second electrode of the second sensing transistor T2 is coupled to a first electrode of the third sensing transistor T3 and a control electrode of the fifth sensing transistor T5.

A control electrode of the third sensing transistor T3 is coupled to the pull-down node PD, and a second electrode of the third sensing transistor T3 is coupled to the second power supply terminal.

A control electrode of the fourth sensing transistor T4 is coupled to the sensing reset signal terminal STD, a first electrode of the fourth sensing transistor T4 is coupled to the pull-up node PU, and a second electrode of the fourth sensing transistor T4 is coupled to the second power supply terminal.

A first electrode of the fifth sensing transistor T5 is coupled to the first power supply terminal, and a second electrode of the fifth sensing transistor T5 is coupled to the pull-up node PU.

In some implementations, the shift register of the embodiment of the present disclosure further includes a second capacitor C2, a first electrode of the second capacitor C2 is coupled to the sensing control node H, and a second electrode of the second capacitor C2 is coupled to the control electrode of the fifth sensing transistor T5 or to the second power supply terminal.

The driving timing of the shift register shown in FIG. 10 can be as shown in FIG. 6, and the driving process of the shift register shown in FIG. 10 is the same as the driving process of the shift register shown in FIG. 6, and is not repeated herein.

Figure 11:
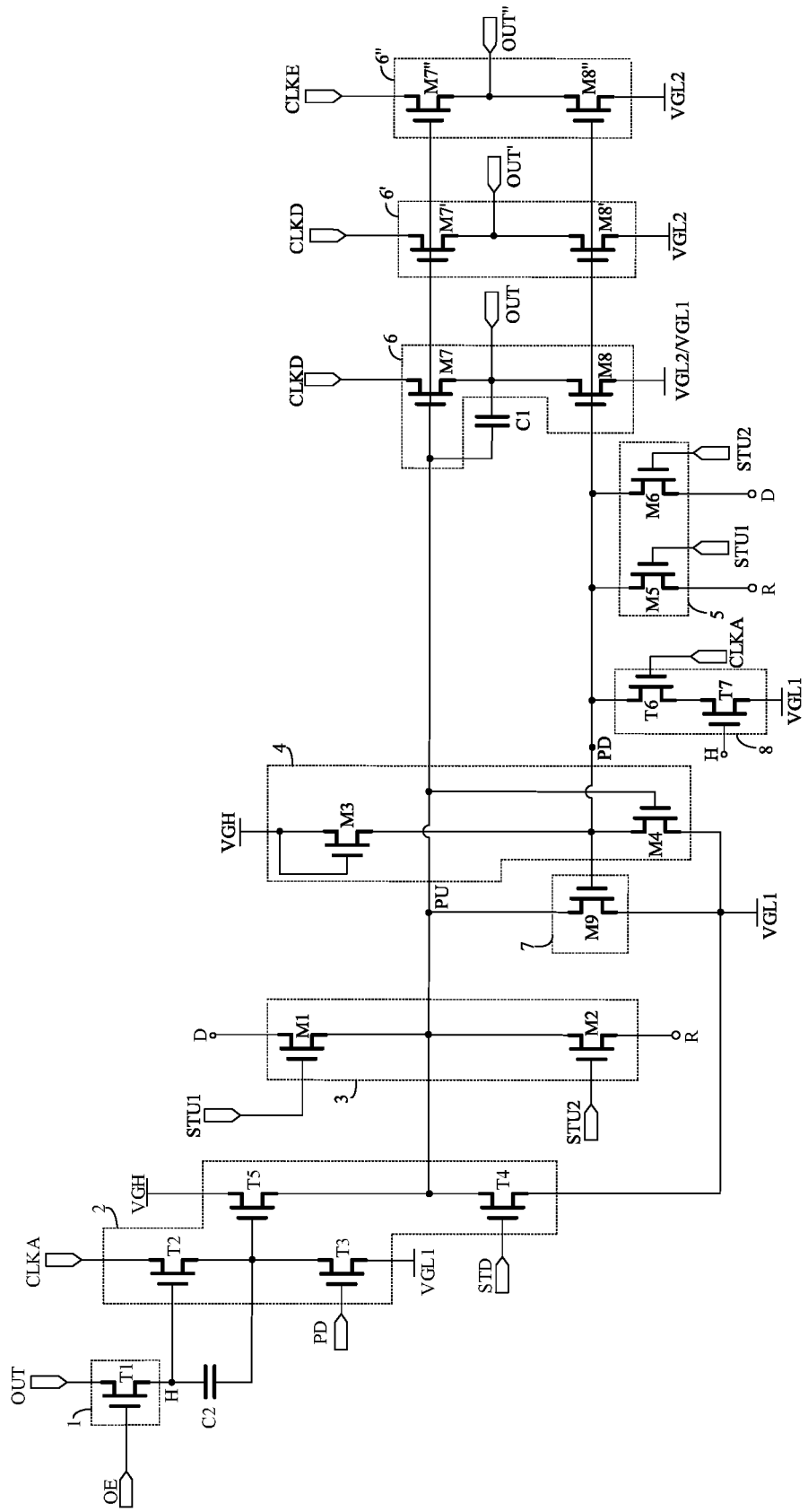
FIG. 11 is a schematic circuit diagram of a shift register according to an embodiment of the present disclosure.

FIG. 11 is another schematic circuit diagram of a shift register according to an embodiment of the present disclosure, and as shown in FIG. 11, unlike the shift register shown in FIG. 10, in this embodiment, three signal output terminals are included, that is, the shift register includes signal output terminals OUT, OUT', and OUT", and correspondingly, three output sub-circuits are included, that is, the shift register includes output sub-circuits 6, 6', and 6". The seventh display transistors M7, M7' and M7" in the respective output sub-circuits 6, 6' and 6" are simultaneously turned on or off, and the eighth display transistors M8, M8' and M8" in the respective output sub-circuits 6, 6' and 6" are simultaneously turned on or off. The output sub-circuit 6 and the output sub-circuit 6' are both coupled to the output clock signal terminal CLKD, and the output sub-circuit 6' is coupled to the output clock signal terminal CLKE.

It should be noted that, in the shift register shown in FIG. 11, the second electrode of the eighth display transistor M8 may be coupled to the second power supply terminal, instead of the reset power supply terminal.

Figure 12:
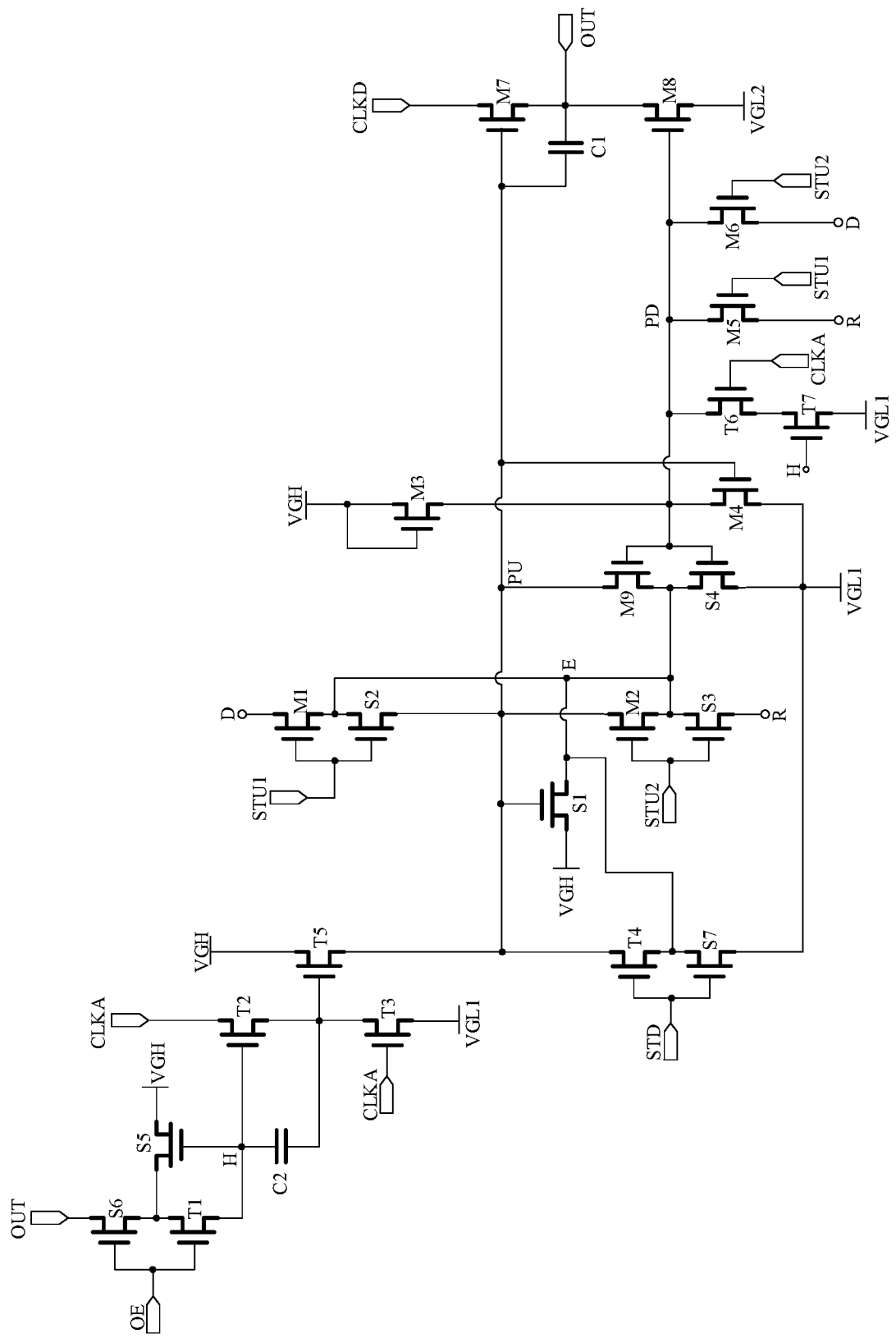
FIG. 12 is a schematic circuit diagram of a shift register according to an embodiment of the present disclosure.

FIG. 12 is another schematic circuit diagram of a shift register according to an embodiment of the present disclosure, and as shown in FIG. 12, unlike shift registers shown in FIGS. 10 and 11, an anti-leakage circuit is disposed in the shift register shown in FIG. 12.

In some implementations, the anti-leakage circuit includes: a first anti-leakage transistor S1, a second anti-leakage transistor S2, a third anti-leakage transistor S3, a fourth anti-leakage transistor S4, a fifth anti-leakage transistor S5, a sixth anti-leakage transistor S6, and a seventh anti-leakage transistor S7. For the specific description of each anti-leakage transistor in FIG. 12, reference may be made to the description of FIG. 9 in the foregoing embodiment, and details are not repeated here.

Figure 13:
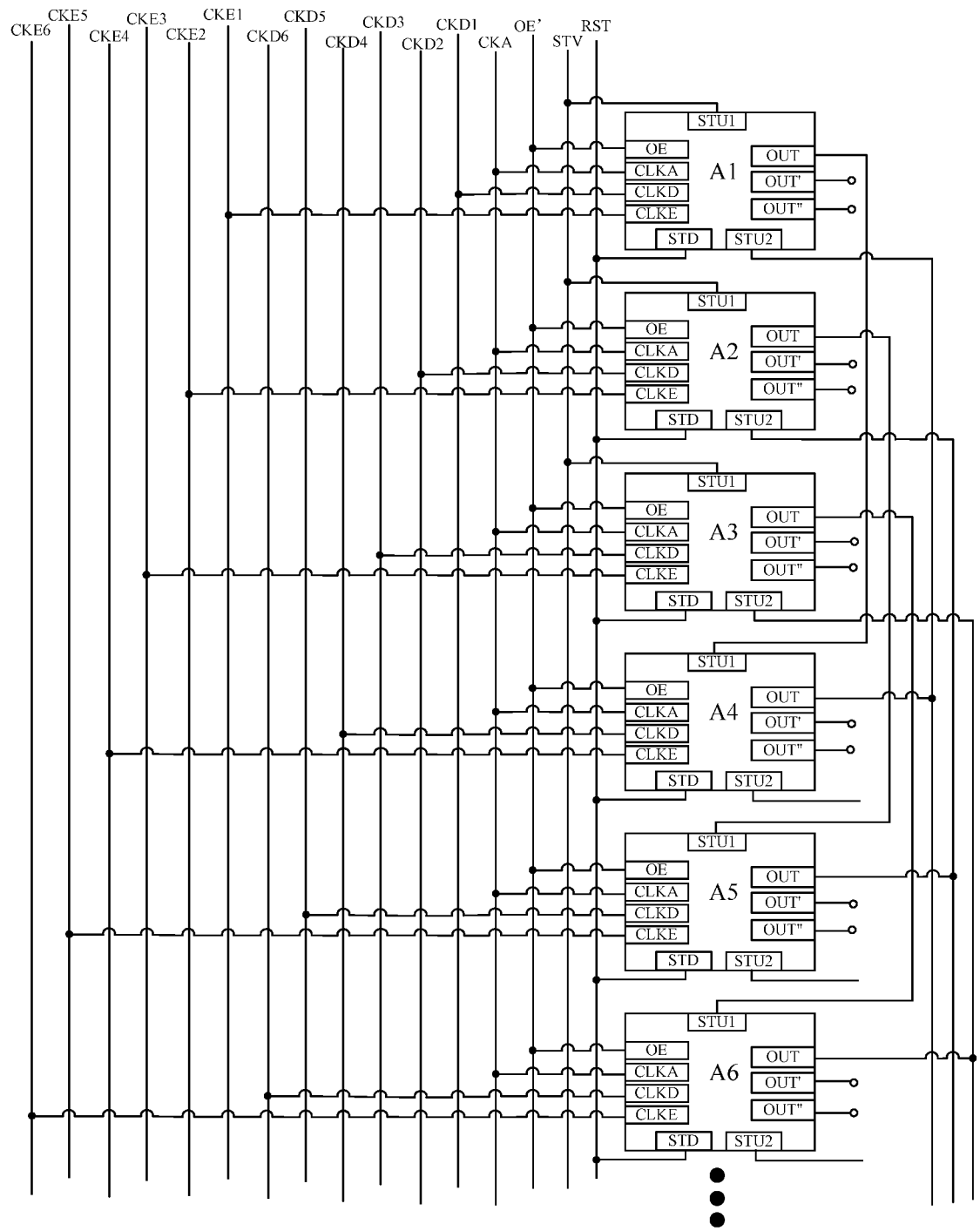
FIG. 13 is a schematic circuit diagram of a gate driving circuit according to an embodiment of the present disclosure.
Figure 14:
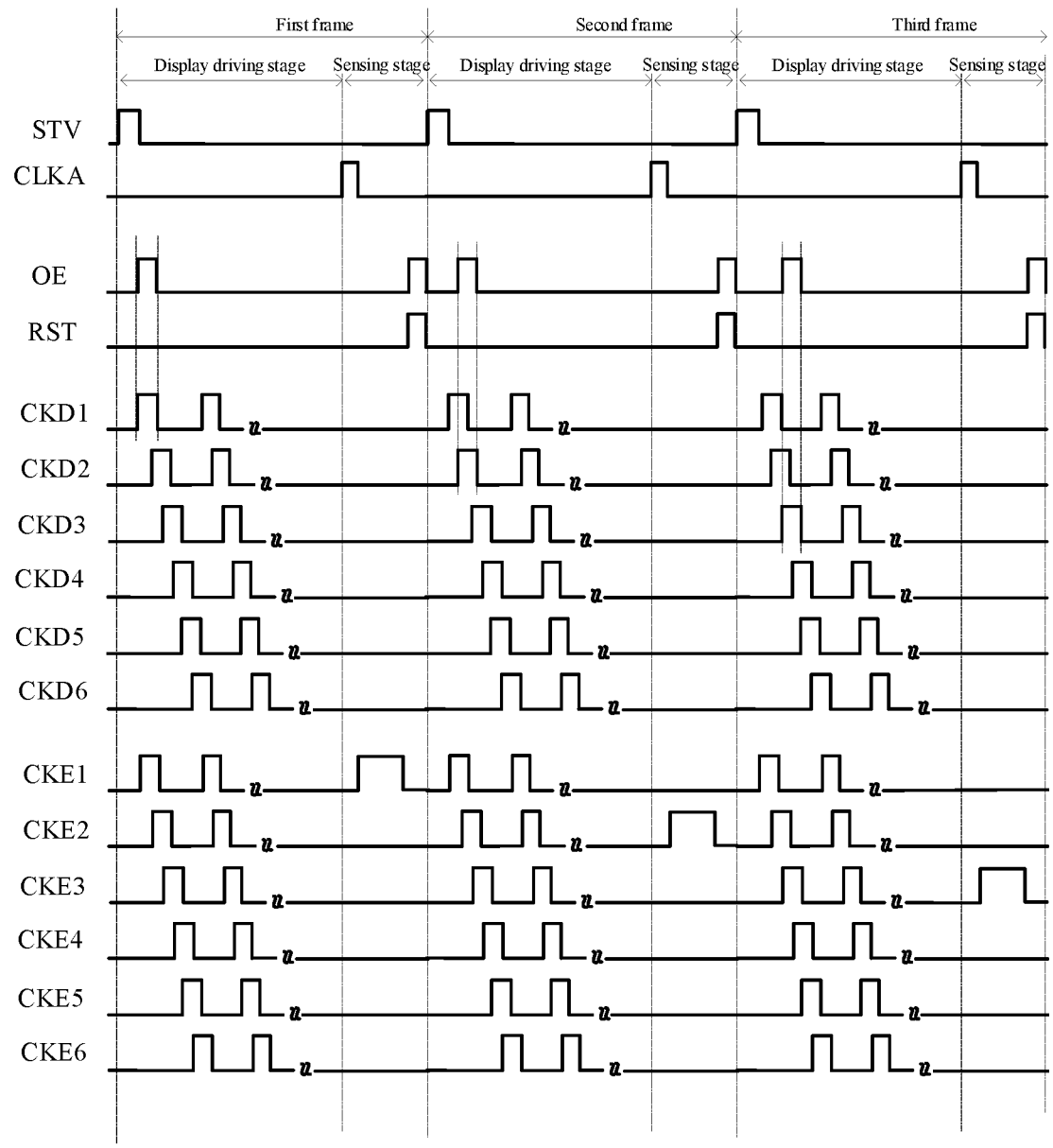
FIG. 14 is a timing diagram illustrating an operation of the gate driving circuit shown in FIG. 13.

FIG. 13 is a schematic circuit diagram of a gate driving circuit according to an embodiment of the present disclosure, and FIG. 14 is a timing diagram illustrating an operation of the gate driving circuit shown in FIG. 13, and as shown in FIG. 13 and FIG. 14, the gate driving circuit includes: N shift registers A1, A2, A3, A4, A5, A6, and so on cascaded and each provided by any of the above embodiments, and for the corresponding descriptions of the shift registers A1, A2, A3, A4, A5, and A6, reference may be made to corresponding contents in the foregoing embodiments, and details are not repeated here.

It should be noted that FIG. 13 only exemplarily shows first six stages of shift registers in the gate driving circuit, and in fact, the gate driving circuit may include N stages of shift registers, where N is a positive integer.

In a case where the gate driving circuit includes N stages of shift registers, first signal input terminals STU1 of the shift registers at previous m stages may be coupled to a frame start signal input terminal STV, and the first signal input terminal STU1 of the shift register at an $i^{th}$ stage may be coupled to one signal output terminal OUT of the shift register at an $(i-m)^{th}$ stage, where m is a preset positive integer, i is greater than or equal to m−1 and less than or equal to N, and i is a positive integer. The random signal terminal OE of the shift register at each stage can be coupled to the random signal input terminal OE'; the second signal input terminals STU2 of the shift registers from an $(N-m)^{th}$ to an $N^{th}$ stages may be coupled to a frame reset signal input terminal, and the second signal input terminal STU2 of a $k^{th}$ stage may be coupled to one signal output terminal OUT of the shift register at a $(k+m)^{th}$ stage, where k is greater than or equal to 1 and less than or equal to N−m, and k is a positive integer; the sensing reset signal terminal STD of the shift register at each stage may be coupled to the sensing reset signal line RST. The first clock signal terminal CLKA of the shift register at each stage may be coupled to the first clock signal line CKA, and the sensing reset signal terminal STD of the shift register at each stage may be coupled to the sensing reset signal line RST.

In the forward scanning, the frame start signal input terminal STV provides a frame start signal, and the frame reset signal input terminal provides a frame reset signal. In the reverse scanning, the frame start signal input terminal STV provides a frame reset signal, and the frame reset signal input terminal provides a frame start signal.

In some implementations, the shift register at each stage is configured with three corresponding signal output terminals (the shift register at each stage has three output sub-circuits), which are a first cascade signal output terminal OUT, a first driving signal output terminal OUT' and a second driving signal output terminal OUT".

The signal output terminal coupled to the sensing control circuit of the shift register at each stage may be the first cascade signal output terminal OUT corresponding to the shift register of the present stage; the first signal input terminal STU1 of the shift register at the $i^{th}$ stage may be coupled to the first cascade signal output terminal OUT of the shift register at the $(i-m)^{th}$ stage; the second signal input terminal STU2 of the shift register at the $k^{th}$ stage may be coupled to the first cascade signal output terminal OUT of the shift register at the $(k+m)^{th}$ stage; the first driving signal output terminal OUT' and the second driving signal output terminal OUT" of the shift register at each stage may be respectively coupled to two gate lines of corresponding rows.

In some implementations, m has a value of 3. That is, the first signal input terminals STU1 of the shift registers of the previous three stages are coupled to the frame start signal input terminal STV, the second signal input terminals STU2 of the shift registers from the $(N-3)^{th}$ stage to the $N^{th}$ stage are coupled to the frame reset signal input terminal, the first signal input terminal STU1 of the shift register at the $i^{th}$ stage is coupled to the first cascade signal output terminal OUT of the shift register at the $(i-3)^{th}$ stage, and the second signal input terminal STU2 of the shift register at the $k^{th}$ stage is coupled to the first cascade signal output terminal OUT of the shift register located at the $(k+3)^{th}$ stage.

In some implementations, twelve output clock signal lines, including six first output clock signal lines CKD1 to CKD6 and six second output clock signal lines CKE1 to CKE6, may be configured for the gate driving circuit of the embodiment of the present disclosure.

In the shift register at the $(6j-5)^{th}$ stage, the output clock signal terminal CKD coupled to the output sub-circuit provided with the first cascade signal output terminal OUT and the output clock signal terminal CKD coupled to the output sub-circuit provided with the first driving signal output terminal OUT' are coupled to a first output clock signal line CKD1; the output clock signal terminal CKE coupled to the output sub-circuit configured with the second driving signal output terminal OUT" is coupled to a second output clock signal line CKE1, where 6j is less than or equal to N, and j is an integer.

In the shift register at the $(6j-4)^{th}$ stage, the output clock signal terminal CKD coupled the an output sub-circuit provided with the first cascade signal output terminal OUT and the output clock signal terminal CKD coupled to the output sub-circuit provided with the first driving signal output terminal OUT' are coupled to a first output clock signal line CKD2; the output clock signal terminal CKE coupled to the output sub-circuit provided with the second driving signal output terminal OUT" is coupled to a second output clock signal line CKE2.

In the shift register at the $(6j-3)^{th}$ stage, the output clock signal terminal CKD coupled to the output sub-circuit provided with the first cascade signal output terminal OUT and the output clock signal terminal CKD coupled to the output sub-circuit provided with the first driving signal output terminal OUT' are both coupled to a first output clock signal line CKD3; the output clock signal terminal CKE coupled to the output sub-circuit provided with the second driving signal output terminal OUT" is coupled to a second output clock signal line CKE3.

In the shift register at the $(6j-2)^{th}$ stage, the output clock signal terminal CKD coupled to the output sub-circuit provided with the first cascade signal output terminal OUT and the output clock signal terminal CKD coupled to the output sub-circuit provided with the first driving signal output terminal OUT' are coupled to a first output clock signal line CKD4; the output clock signal terminal CKE coupled to the output sub-circuit provided with the second driving signal output terminal OUT" is coupled to a second output clock signal line CKE4.

In the shift register at the $(6j-1)^{th}$ stage, the output clock signal terminal CKD coupled to the output sub-circuit provided with the first cascade signal output terminal OUT and the output clock signal terminal CKD coupled to the output sub-circuit provided with the first driving signal output terminal OUT' are coupled to a first output clock signal line CKD5; the output clock signal terminal CKE coupled to the output sub-circuit provided with the second driving signal output terminal OUT" is coupled to a second output clock signal line CKE5.

In the shift register of the $6j^{th}$ stage, the output clock signal terminal CKD coupled to the output sub-circuit provided with the first cascade signal output terminal OUT and the output clock signal terminal CKD coupled to the output sub-circuit provided with the first drive signal output terminal OUT' are coupled to a first output clock signal line CKD6; the output clock signal terminal CKE coupled to the output sub-circuit provided with the second driving signal output terminal OUT" is coupled to a second output clock signal line CKE6.

One first output clock signal line and one second output clock signal line (for example, CKD1 and CKE1, CKD2 and CKE2) coupled to a same shift register have the same timing in the display driving stage, and the timing in the sensing stage may be the same (when the first driving signal output terminal OUT' and the second driving signal output terminal OUT" need to output the same waveform signal in the sensing stage), or may be different (when the first driving signal output terminal OUT' and the second driving signal output terminal OUT" need to output different waveform signals in the sensing stage). It should be noted that FIG. 14 only exemplarily shows the driving timing of three consecutive frames when the gate driving circuit performs the forward scanning.

An embodiment of the present disclosure further provides a display device, including: the gate driving circuit provided by the above embodiment.

Figure 15:
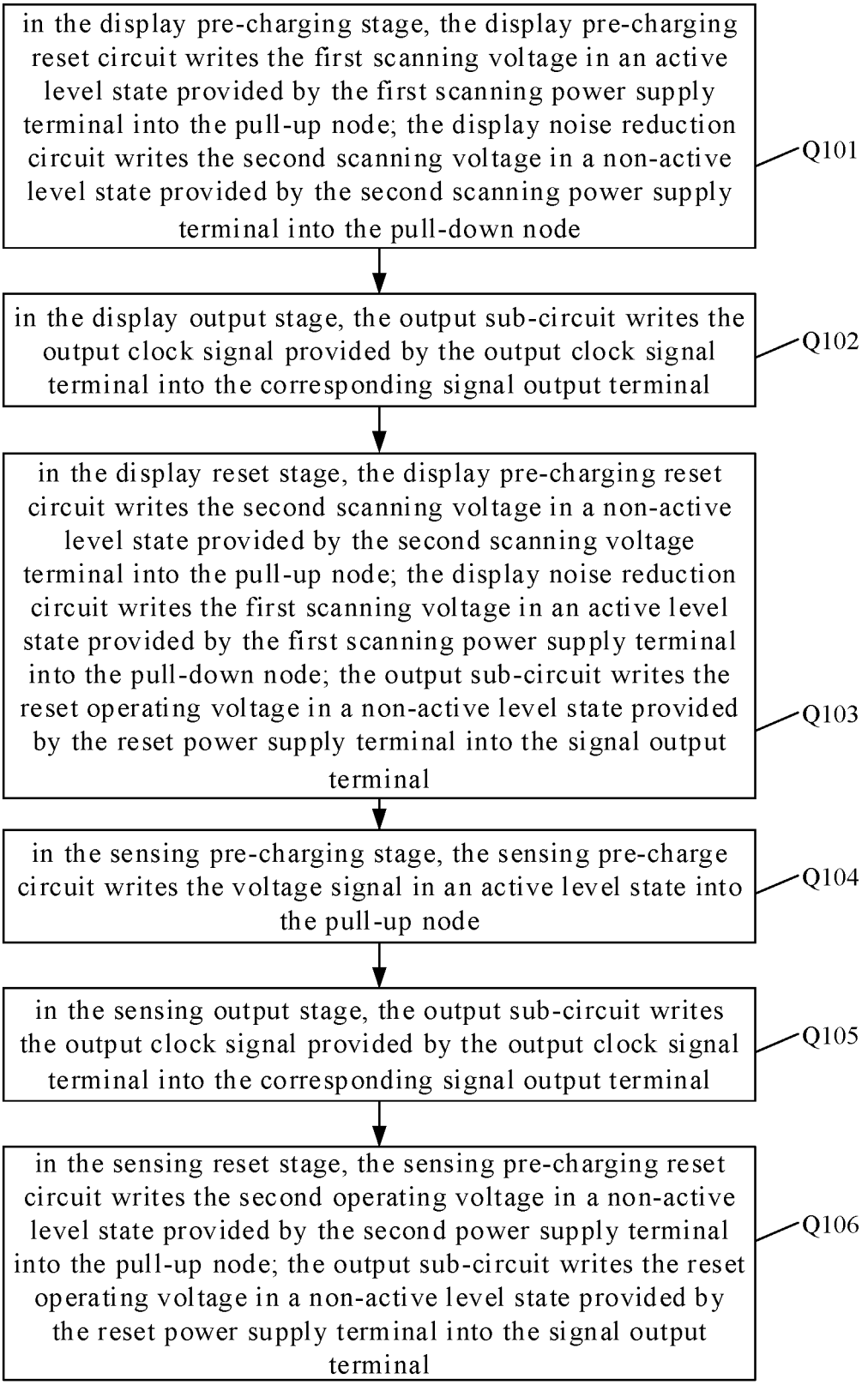
FIG. 15 is a flowchart of a gate driving method according to an embodiment of the present disclosure.

FIG. 15 is a flowchart of a gate driving method according to an embodiment of the present disclosure, and as shown in FIG. 15, the gate driving method is based on the shift register provided in the foregoing embodiment, and when the gate driving circuit performs the forward scanning, the gate driving method includes following steps Q101 to Q106.

Step Q101, in the display pre-charging stage, the display pre-charging reset circuit writes the first scanning voltage in an active level state provided by the first scanning power supply terminal into the pull-up node in response to the control of the first input signal provided by the first signal input terminal; the display noise reduction circuit writes the second scanning voltage in a non-active level state provided by the second scanning power supply terminal into the pull-down node in response to the control of the first input signal provided by the first signal input terminal.

Step Q102, in the display output stage, the output sub-circuit writes the output clock signal provided by the output clock signal terminal into the corresponding signal output terminal in response to the control of the voltage of the pull-up node in an active level state; and in the display output stage, the stage that the output clock signal is in an active level state is the sensing control stage, and in the sensing control stage, the sensing control circuit writes the output signal in an active level state output by the signal output terminal into the sensing control node in response to the control of the random signal provided by the random signal terminal.

Step Q103, in the display reset stage, the display pre-charging reset circuit writes the second scanning voltage in a non-active level state provided by the second scanning voltage terminal into the pull-up node in response to the control of the second input signal provided by the second signal input terminal; the display noise reduction circuit writes the first scanning voltage in an active level state provided by the first scanning power supply terminal into the pull-down node in response to the control of the second input signal provided by the second signal input terminal; the output sub-circuit writes the reset operating voltage in a non-active level state provided by the reset power supply terminal into the signal output terminal in response to the control of the voltage of the pull-down node in an active level state.

Step Q104, in the sensing pre-charging stage, the sensing pre-charging circuit writes the voltage signal in an active level state into the pull-up node in response to the voltage of the sensing control node and the control of the first clock signal provided by the first clock signal terminal.

Step Q105, in the sensing output stage, the output sub-circuit writes the output clock signal provided by the output clock signal terminal into the corresponding signal output terminal in response to the control of the voltage of the pull-up node in an active level state.

Step Q106, in the sensing reset stage, the sensing pre-charging reset circuit writes the second operating voltage in a non-active level state provided by the second power supply terminal into the pull-up node in response to the control of the sensing reset signal provided by the sensing reset signal terminal; the output sub-circuit writes the reset operating voltage in a non-active level state provided by the reset power supply terminal into the signal output terminal in response to the control of the voltage of the pull-down node in an active level state.

For the specific description of the steps Q101 to Q106, reference may be made to the corresponding contents in the foregoing embodiment, and details are not repeated here.

Figure 16:
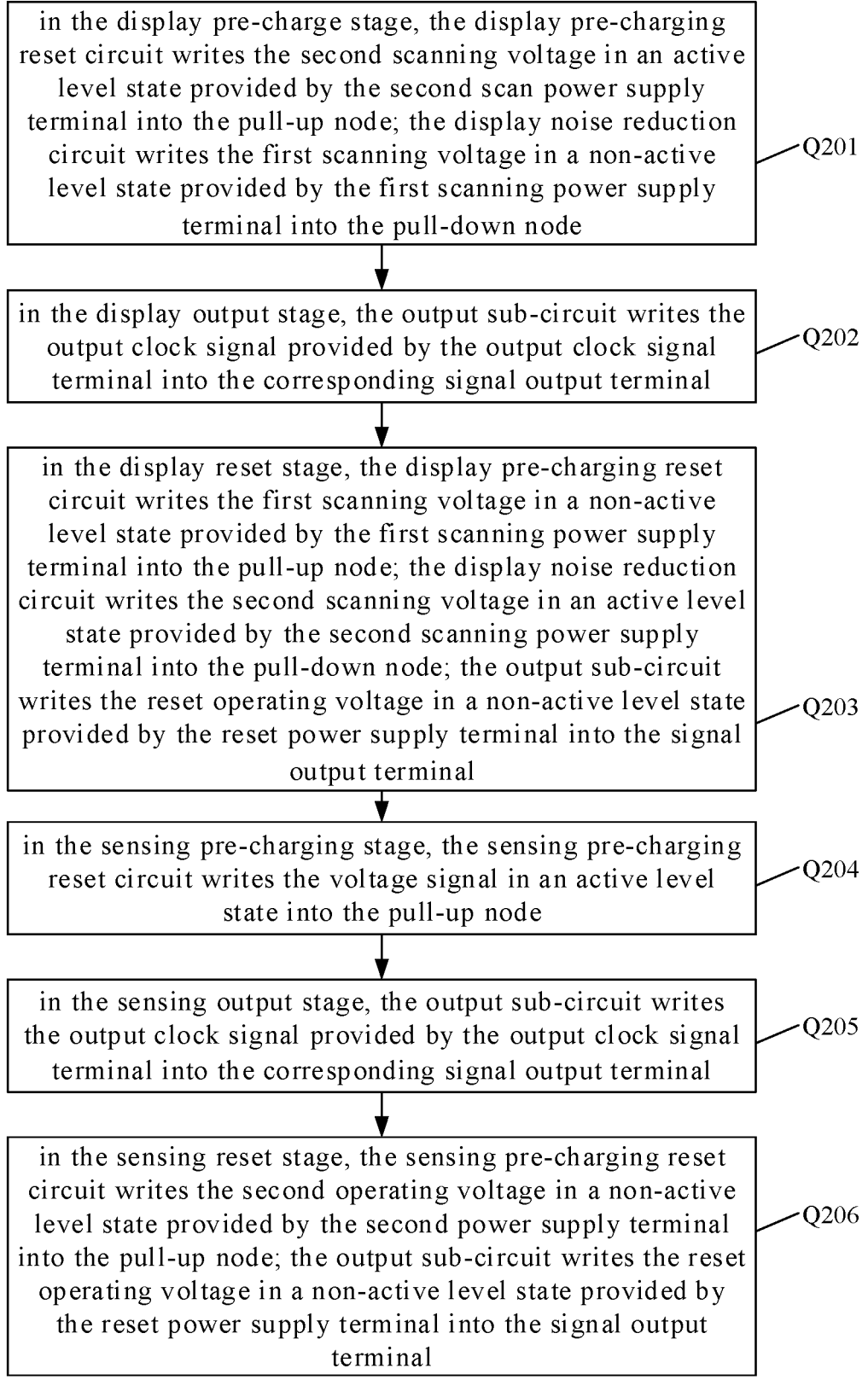
FIG. 16 is a flowchart of a gate driving method according to an embodiment of the present disclosure.

FIG. 16 is another flowchart of a gate driving method according to an embodiment of the present disclosure, and as shown in FIG. 16, the gate driving method is based on the shift register provided in the foregoing embodiment, and when the gate driving circuit performs the reverse scanning, the gate driving method includes following steps Q201 to Q206.

Step Q201, in the display pre-charging stage, the display pre-charging reset circuit writes the second scanning voltage in an active level state provided by the second scan power supply terminal into the pull-up node in response to the control of the second input signal provided by the second signal input terminal; the display noise reduction circuit writes the first scanning voltage in a non-active level state provided by the first scanning power supply terminal into the pull-down node in response to the control of the second input signal provided by the second signal input terminal.

Step Q202, in the display output stage, the output sub-circuit writes the output clock signal provided by the output clock signal terminal into the corresponding signal output terminal in response to the control of the voltage of the pull-up node in an active level state; and in the display output stage, the stage that the output clock signal is in an active level state is the sensing control stage, and in the sensing control stage, the sensing control circuit writes the output signal in an active level state output by the signal output terminal into the sensing control node in response to the control of the random signal provided by the random signal terminal.

Step Q203, in the display reset stage, the display pre-charging reset circuit writes the first scanning voltage in a non-active level state provided by the first scanning power supply terminal into the pull-up node in response to the control of the first input signal provided by the first signal input terminal; the display noise reduction circuit writes the second scanning voltage in an active level state provided by the second scanning power supply terminal into the pull-down node in response to the control of the first input signal provided by the first signal input terminal; the output sub-circuit writes the reset operating voltage in a non-active level state provided by the reset power supply terminal into the signal output terminal in response to the control of the voltage of the pull-down node in an active level state.

Step Q204, in the sensing pre-charging stage, the sensing pre-charging reset circuit writes the voltage signal in an active level state into the pull-up node in response to the voltage of the sensing control node and the control of the first clock signal provided by the first clock signal terminal.

Step Q205, in the sensing output stage, the output sub-circuit writes the output clock signal provided by the output clock signal terminal into the corresponding signal output terminal in response to the control of the voltage of the pull-up node in an active level state.

Step Q206, in the sensing reset stage, the sensing pre-charging reset circuit writes the second operating voltage in a non-active level state provided by the second power supply terminal into the pull-up node in response to the control of the sensing reset signal provided by the sensing reset signal terminal; the output sub-circuit writes the reset operating voltage in a non-active level state provided by the reset power supply terminal into the signal output terminal in response to the control of the voltage of the pull-down node in an active level state.

For the specific description of the steps Q201 to Q206, reference may be made to the corresponding contents in the foregoing embodiment, and details are not repeated here.

It should be noted that, in the embodiment of the present disclosure, the low level operating voltage VGL1 may be smaller than the low level operating voltage VGL2, that is, the potential of VGL2 may be higher than the potential of VGL1 (generally, both VGL1 and VGL2 are negative potentials), and both may be direct current low potential signals. However, it should be understood that values of the low level operating voltages VGL1 and VGL2 may be the same or different according to requirements, and the embodiment of the disclosure is not particularly limited in this respect.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A gate driving method for a shift register, the shift register comprises: a display pre-charging reset circuit, a sensing control circuit, a sensing pre-charging reset circuit, a pull-down control circuit, a display noise reduction circuit and an output circuit, wherein the sensing control circuit and the sensing pre-charging reset circuit are coupled to a sensing control node; the display pre-charging reset circuit, the sensing pre-charging reset circuit, the pull-down control circuit and the output circuit are coupled to a pull-up node, the pull-down control circuit, the display noise reduction circuit and the output circuit are coupled to the pull-down node, and the output circuit is configured with at least one signal output terminal, the output circuit comprises at least one output sub-circuit arranged in one-to-one correspondence to the at least one signal output terminal;

the display pre-charging reset circuit is coupled to a first signal input terminal, a second signal input terminal, a first scanning power supply terminal and a second scanning power supply terminal, and is configured to write a first scanning voltage provided by the first scanning power supply terminal into the pull-up node in response to a control of the first signal input terminal; and write a second scanning voltage provided by said second scanning power supply terminal into the pull-up node in response to a control of the second signal input terminal;

the sensing control circuit is coupled to the signal output terminal and a random signal terminal, and is configured to write an output signal provided by the signal output terminal into the sensing control node in response to a control of the random signal terminal;

the sensing pre-changing reset circuit is coupled to a first clock signal terminal, a sensing reset signal terminal and a second power supply terminal, and is configured to write a voltage signal in an active level state into the pull-up node in response to a control of a voltage at the sensing control node; and write a second operating voltage provided by the second power supply terminal into the pull-up node in response to a control of the sensing reset signal terminal;

the pull-down control circuit is coupled to a first power supply terminal and the second power staidly terminal, and is configured to write a voltage, with a phase opposite to that of a voltage at the pull-up node, into the pull-down node;

the display noise reduction circuit is coupled to the first signal input terminal, the second signal input terminal, the first scanning power supply terminal and the second scanning power supply terminal, and is configured to write the second scanning voltage into the pull-down node in response to the control of the first signal input terminal; and write the first scanning voltage into the pull-down node in response to the control of the second signal input terminal;

the output sub-circuit is coupled to the pull-up node, the pull-down node, the corresponding signal output terminal, a corresponding output clock signal terminal and a reset power supply terminal, and is configured to write an output clock signal provided by the corresponding output clock signal terminal into the corresponding signal output terminal in response to a control of the voltage at the pull-up node; and write a reset operating voltage provided by the reset power supply terminal into the corresponding signal output terminal in response to a control of a voltage at the pull-down node, the gate driving method comprising:

in a display pre-charging stage, the display pre-charging reset circuit controls a potential of the pull-up node; the display noise reduction circuit controls a potential of the pull-down node;

in a display output stage, the output sub-circuit writes an output clock signal provided by the output clock signal terminal into the corresponding signal output terminal in response to a control of a voltage of the pull-up node in an active level state; and in the display output stage, a stage that the output clock signal is in an active level state is a sensing control stage, and in the sensing control stage, the sensing control circuit writes the output signal in an active level state output by the signal output terminal into the sensing control node in response to a control of a random signal provided by the random signal terminal;

in a display reset stage, the display pre-charging reset circuit controls the potential of the pull-up node; and the display noise reduction circuit controls the potential of the pull-down node; the output sub-circuit controls a potential of the signal output terminal according to the voltage of the pull-down node;

in a sensing pre-charging stage, the sensing pre-charging circuit writes a voltage signal in an active level state into the pull-up node in response to a voltage of the sensing control node and a control of a first clock signal provided by the first clock signal terminal;

in a sensing output stage, the output sub-circuit writes an output clock signal provided by the output clock signal terminal into the corresponding signal output terminal in response to the control of the voltage of the pull-up node in an active level state;

in a sensing reset stage, the sensing pre-charging reset circuit writes a second operating voltage in a non-active level state provided by the second power supply terminal into the pull-up node in response to a control of a sensing reset signal provided by the sensing reset signal terminal; the output sub-circuit writes a reset operating voltage in a non-active level state provided by the reset power supply terminal into the signal output terminal in response to the control of the voltage of the pull-down node in an active level state, in the display pre-charging stage, the display pre-charging reset circuit writes a second scanning voltage in an active level state provided by the second scanning power supply terminal into the pull-up node in response to a control of a second input signal provided by the second signal input terminal, the display noise reduction circuit writes a first scanning voltage in a non-active level state provide the first scanning power supply terminal into the pull-down node in response to a control of a second input signal provided by the second signal input terminal;

in the display reset stage, the display pre-charging reset circuit writes a first scanning voltage in a non-active level state provided by the first scanning power supply terminal into the pull-up node in response to a control of a first input signal provided by the first signal input terminal; the display noise reduction circuit writes the second scanning voltage in an active level state provided by the second scanning power supply terminal into the pull-down node in response to the control of the first input signal provided by the first signal input terminal; the output sub-circuit writes a reset operating voltage in a non-active level state provided by the reset power supply terminal into the signal output terminal in response to the control of the voltage of the pull-down node in an active level state, wherein, in the display pre-charging stage, the first input signal is in a non-active level state, the second input signal is in an active level state, the random signal is in a non-active level state, the first dock signal is in a non-active level state, the sensing reset signal is in a non-active level state, and the output clock signal is in a non-active level state;

in the display output state, the first input signal is in a non-active level state, the second input signal is in a non-active level state, the random signal is in an active level state in a display active level output stage and is in a non-active level state in a display non-active level output stage, the first clock signal is in a non-active level state, the sensing reset signal is in a non-active level state, the output clock signal is in an active level state in the display active level output stage and is in a non-active level state in the display non-active level output stage;

in the display reset stage, the first input signal is in an active level state, the second input signal is in a non-active level state, the random signal is in a non-active level state, the first clock signal is in a non-active level state, the sensing reset signal is in a non-active level state, and the output clock signal is switched between a non-active level state and an active level state;

in the sensing pre-charging stage, the first input signal is in a non-active level state, the second input signal is in a non-active level state, the random signal is in a non-active level state, the first clock signal is in an active level state, the sensing reset signal is in a non-active level state, and the output clock signal is in a non-active level state;

in the sensing output stage, the first input signal is in a non-active level state, the second input signal is in a non-active level state, the random signal is in a non-active level state, the first clock signal is in a non-active level state, the sensing reset signal is in a non-active level state, the output clock signal is in an active level state in a sensing active level output stage and is in a non-active level state in a sensing non-active level output stage;

in the sensing reset stage, the first input signal is in a non-active level state, the second input signal is in a non-active level state, the random signal is in an active level state, the first clock signal is in a non-active level state, the sensing reset signal is in an active level state, and the output clock signal is in a non-active level state.

* * * * *